(12) United States Patent
Yokota et al.

(10) Patent No.: US 7,793,183 B2
(45) Date of Patent: Sep. 7, 2010

(54) MICROCOMPUTER AND METHOD OF TESTING THE SAME

(75) Inventors: Toshihiko Yokota, Kyoto (JP); Ken Namura, Kanagawa (JP); Mitsuru Sugimoto, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 405 days.

(21) Appl. No.: 11/916,702

(22) PCT Filed: Jun. 8, 2006

(86) PCT No.: PCT/JP2006/311551

§ 371 (c)(1),
(2), (4) Date: Dec. 6, 2007

(87) PCT Pub. No.: WO2006/132329

PCT Pub. Date: Dec. 14, 2006

(65) Prior Publication Data

US 2009/0119561 A1      May 7, 2009

(30) Foreign Application Priority Data

Jun. 10, 2005   (JP)   ............................... 2005-171268

(51) Int. Cl.
   *G01R 31/28*   (2006.01)
(52) U.S. Cl. ...................................... 714/731; 714/726
(58) Field of Classification Search ................. 714/731, 714/726, 733, 734, 30, 744
   See application file for complete search history.

(56) References Cited

U.S. PATENT DOCUMENTS

| 6,145,100 A * | 11/2000 | Madduri ....................... 714/45 |
| 6,760,873 B1 | 7/2004 | Hao et al. |
| 6,872,121 B2 * | 3/2005 | Wiesner et al. ................ 451/5 |

(Continued)

FOREIGN PATENT DOCUMENTS

JP             06-289099           10/1994

(Continued)

OTHER PUBLICATIONS

Mohanram k et al: "Eliminating non-determinism during test of high-speed source synchronous differential buses", VLSI Test Symposium, 2003, pp. 121-127.

*Primary Examiner*—Phung M Chung
(74) *Attorney, Agent, or Firm*—Yuanmin Cai

(57) ABSTRACT

Embodiments of the present invention provide a microcomputer on which a plurality of ICs (Integrated Circuits) connected from one another by a source-synchronous interface is mounted. The microcomputer includes an IC on the side for transmitting data through the source-synchronous interface which further includes: a PLL (Phase-Locked Loop) circuit being adapted for transmitting an operation clock in actual operation; a first flip-flop being adapted for transmitting test data in accordance with the operation clock transmitted from the PLL circuit; and a second flip-flop being adapted for transmitting a synchronous clock in source-synchronous, in accordance with the operation clock transmitted from the PLL circuit, a synchronous clock in source synchronous, and an IC on the side for receiving data through the source-synchronous interface which further includes a third flip-flop being adapted for capturing, in accordance with the synchronous clock transmitted from the second flip-flop, the test data transmitted from the first flip-flop. Methods for testing the microcomputer are also provided.

12 Claims, 20 Drawing Sheets

U.S. PATENT DOCUMENTS

| | | | |
|---|---|---|---|
| 6,892,314 B2 * | 5/2005 | Chen | 713/401 |
| 7,000,164 B2 * | 2/2006 | Siegel et al. | 714/731 |
| 7,228,476 B2 * | 6/2007 | Scipioni et al. | 714/733 |
| 2002/0144189 A1 * | 10/2002 | Chen | 714/43 |
| 2003/0189973 A1 | 10/2003 | Doblar et al. | |
| 2003/0229835 A1 | 12/2003 | Whetsel | |
| 2005/0149801 A1 | 7/2005 | Oshima | |

FOREIGN PATENT DOCUMENTS

| | | |
|---|---|---|
| JP | 08-240645 | 9/1996 |
| JP | 2004294424 | 10/2004 |
| WO | WO2004061465 | 7/2004 |
| WO | WO2006132329 | 12/2006 |

* cited by examiner

MICROCOMPUTER AND METHOD OF TESTING THE SAME

CROSS-REFERENCE TO RELATED APPLICATIONS

The present application claims the benefit of priority of an International Patent Application PCT/JP2006/311551 filed Jun. 8, 2006 which in turn claims benefit of priority of a Japanese Patent Application No. 2005-171268, filed Jun. 10, 2005, both with the Japan Patent Office, the content of which are incorporated herein by reference in their entirety.

FIELD OF THE INVENTION

The present invention relates to a test of an LSI, and particularly to a circuit configuration and a method for implementing a board-level interconnect test on an LSI in an actual operation state.

DESCRIPTION OF RELATED ARTS

At the time of manufacturing a board on which an ASIC (Application Specific Integrated Circuit) designed and fabricated for a particular application is mounted, a boundary-scan test using JTAG is widely performed as a method for checking whether the board is defective or non-defective. In a case where a board-level interconnect test is performed using this JTAG, the test is performed by using only a JTAG circuit without operating a circuit (hereinafter, a user circuit) that performs an intended operation of the ASIC. This makes it possible to perform a test generally, irrespective of the circuit configuration of a user circuit. As a testing method, there is a test called EXTEST standardized by IEEE1149 (see, for example, Non-patent Document 1—IEEE STD1149.1-1990, "IEEE Standard Test Access Port and Boundary-Scan Architecture," published by IEEE, Inc., 345 East 47th Street, NY 10017, USA).

Currently, an HSS interface or a source-synchronous type interface is mainly used as an I/O (Input/Output) interface for a high-speed ASIC. The source-synchronous interface (I/O circuit) is suitable for high speed operation, and is used in: SDRAMs (Synchronous Dynamic Random Access Memories), such as a DDR (Double Data Rate) and QDR (Quad Data Rate); and various high-speed CPU busses. This interface transmits, together with chip data, a clock for latching the chip data, from a transmitting-side (hereinafter, TR-side) chip to a receiving-side (hereinafter, REC-side) chip.

In a test of such a circuit that operates at a high speed, it is considered to be important to also perform a test in an actual operation state (at-speed test), as well as a static test, such as the EXTEST for checking whether the logic is right or wrong.

Conventionally, an at-speed test for a source-synchronous interface at the board level has been performed through a system-level test using a test program developed by a board designer, a system designer, and a microcode designer, of an ASIC.

As mentioned above, it is preferable that an at-speed test be performed on a source-synchronous interface of an ASIC that operates at a high speed. However, there has been no general method for performing an at-speed test for this interface at the board level.

In addition, although an at-speed test is performed at the board level practically through a system-level test as mentioned above, the following problem arises in this case. When results of system-level test show a failure, debugging is required to be performed. However, when the problem lies in the source-synchronous interface, it is not easy to perform this debugging. This is because only data is garbled due to the defect of the interface but the status register in the chip is normal. In other words, only the observed data indicates a problem but the control signal is operating properly. Hence, it is difficult to identify the cause of a problem.

SUMMARY OF EMBODIMENTS OF THE INVENTION

In view of the above problems, an objective of the present invention is to provide a general scheme (circuit configuration and operation method) for performing, at the board level, an at-speed test for a source-synchronous interface inside an ASIC, without employing a system-level test.

The present invention that achieves the above objective may be implemented as a microcomputer having the following configuration. On this microcomputer, a plurality of ICs (Integrated Circuits) connected from one another via a source-synchronous interface are mounted. An IC on the side for transmitting data through the source-synchronous interface includes: a PLL (Phase-Locked Loop) circuit for transmitting an operation clock in actual operation; a first flip-flop for transmitting test data in accordance with the operation clock transmitted from the PLL circuit; and a second flip-flop for transmitting, in accordance with the operation clock transmitted from the PLL circuit, a synchronous clock in source-synchronous. An IC on the side for receiving data through the source-synchronous interface, on the other hand, includes a third flip-flop for capturing, in accordance with the synchronous clock transmitted from the second flip-flop, the test data transmitted from the first flip-flop.

More specifically, the transmitting-side IC further includes a 2-pulse generating circuit for extracting two pulse signals from operation clocks transmitted from the PLL circuit. In addition, the first flip-flop transmits the test data in accordance with the two pulse signals extracted in the 2-pulse generating circuit. Similarly, the second flip-flop transmits the synchronous clock in accordance with the two pulse signals extracted in the 2-pulse generating circuit.

Further more, the first flip-flop of the transmitting-side IC transmits the test data with a delay of a half-cycle of the two pulse signals compared to the synchronous clock transmitted from the second flip-flop. Alternatively, this first flip-flop transmits the test data on the same clock edge as that for the synchronous clock transmitted by the second flip-flop. In the latter case, the receiving-side IC includes delay means, such as a DDL (Digital Delay Line) circuit, and causes the delay means to provide, to the third flip-flop, the received synchronous clock with a delay of $\pi/2$.

This first flip-flop in the transmitting-side IC can be formed of a set/reset flip-flop. In such a case, the transmitting-side IC further includes JTAG TEST DATA RESISTER (hereinafter, JTAG_TDR, see Non-patent Document 1), and causes the first flip-flop to retain the test data by setting or resetting the first flip-flop in accordance with the value retained by this JTAG_TDR. Another possible configuration is that test data is inputted into the first flip-flop by performing a scan-shift on the test data through a scan chain formed of the first flip-flop in the transmitting-side IC.

Moreover, the present invention can also be understood as a method of testing a microcomputer. On the microcomputer on which this test is performed, a plurality of ICs connected from one another via a source-synchronous interface is mounted. This method includes: a step of setting initial values in a first flip-flop for data transmission and a second flip-flop for synchronous clock transmission in an IC on the side for transmitting data through the source-synchronous interface; and a step of transmitting a clock signal from a PLL circuit for transmitting an operation clock in actual operation, and thereafter transmitting the data on the initial values, and the synchronous clock, respectively from the first flip-flop and the second flip-flop. The method also includes a step of causing a third flip-flop for data reception to capture, in accordance with the synchronous clock transmitted from the second flip-flop, the data on the initial values transmitted from the first flip-flop, in an IC on the side for receiving data through the source-synchronous interface.

Here, the step of setting initial values in the first and second flip-flops includes: a step of causing JTAG_TDRs, which are provided to correspond respectively to the first and second flip-flops, to each retain a predetermined value; and a step of causing the JTAG_TDRs to set or reset the first flip-flop and the second flip-flop, in accordance with the values retained therein, so as to set initial values in the first and second flip-flops. Alternatively, in the step of setting initial values in the first and second flip-flops, the initial values are set by performing, with respect to the first and second flip-flops forming a scan chain, a scan shift on test data through the scan chain.

Furthermore, the present invention can also be understood as the following method of testing a microcomputer that includes a plurality of ICs connected via a source-synchronous interface. This testing method includes: a step of causing a flip-flop on the side for transmitting data through the source-synchronous interface to receive and retain test data; a step of transmitting a clock signal from a PLL circuit for transmitting an operation clock in actual operation, and of thereafter transmitting the test data, retained in the transmitting-side flip-flop, and a synchronous clock in source-synchronous; and a step of causing a flip-flop on the side for receiving data through the source-synchronous interface to capture the test data in accordance with the synchronous clock.

Here, the step of causing the transmitting-side flip-flop to receive test data includes: a step of causing a JTAG_TDR to retain a predetermined value, the JTAG_TDR being provided to correspond to the transmitting-side flip-flop; and a step of causing setting or resetting, in accordance with the value retained in the JTAG_TDR, the transmitting-side flip-flop to which the JTAG_TDR corresponds, so as to cause the transmitting-side flip-flop to retain the test data. Alternatively, in the step of causing the transmitting-side flip-flop to receive test data, the transmitting-side flip-flop is caused to retain the test data by performing, with respect to the transmitting-side flip-flop forming a scan chain, a scan shift on test data through the scan chain.

According to the present invention configured as described above, data can be transmitted between chips connected via a source-synchronous interface inside an ASIC, in accordance with the same clock signal as that in actual operation. Subsequently, the result of the data transmission is taken out and evaluated by using a JTAG_TDR for observation provided in a receiving-side chip. This makes it possible to perform an at-speed test at the board level, without employing a system-level test.

Moreover, with this testing method, data that is transmitted through each transmission path can be individually evaluated. Accordingly, when a problem is found, it is possible to easily identify the cause, unlike a system-level test.

DETAILED DESCRIPTION OF EMBODIMENTS

Figure 1:
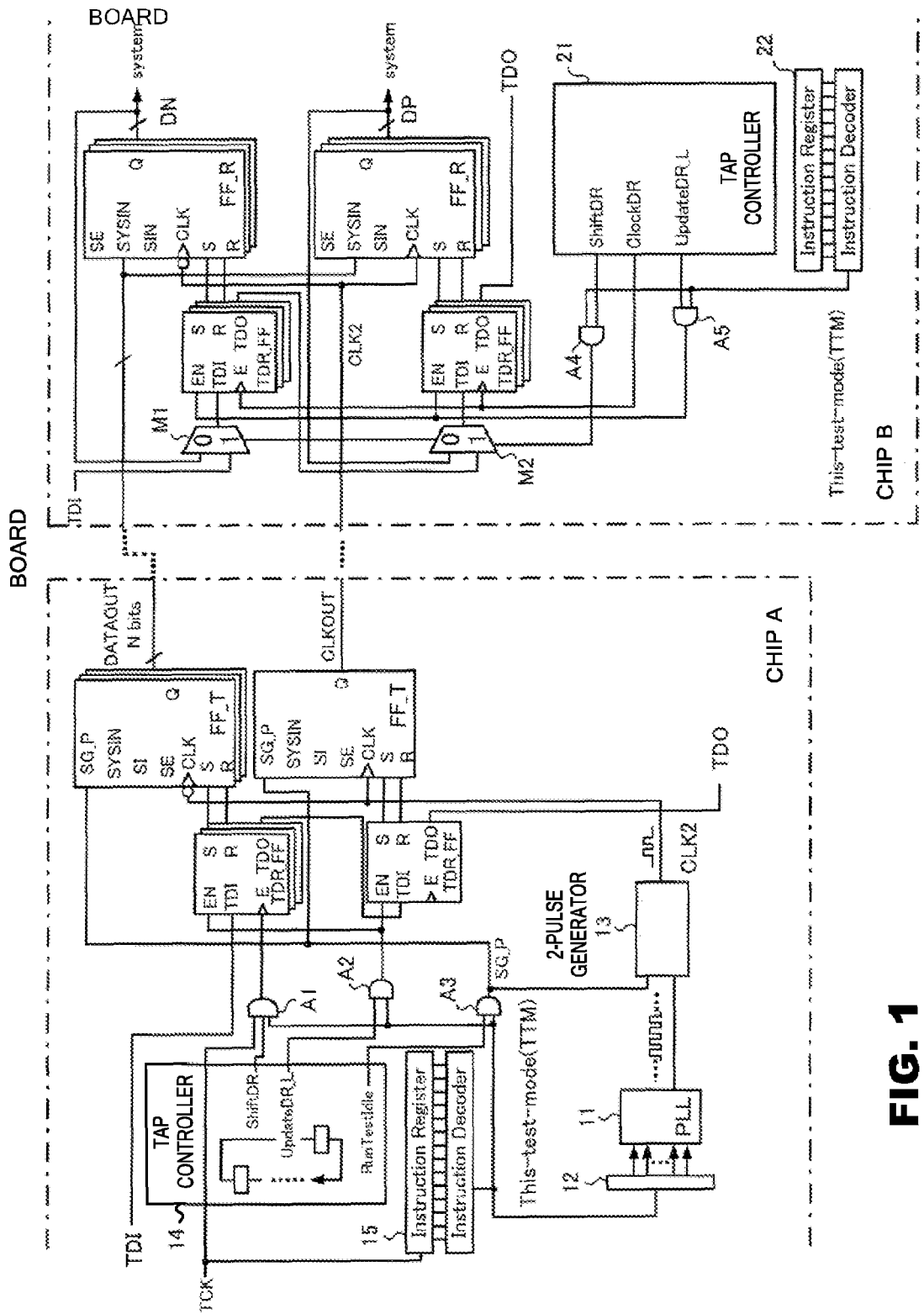
FIG. 1 is a demonstrative diagram showing a configuration of a source-synchronous circuit according to a first embodiment of the present invention.

In the following, best modes (hereafter, embodiments) for carrying out the present invention will be described in detail with reference to the accompanying drawings.

First, a brief summary of the invention will be described. A test of the present invention is performed, by focusing on each pair of two chips (for source-synchronous) between which data exchange is performed, transmission from the TR (transmitting) side chip to the REC (receiving) side chip for a plurality of chips (circuits) included in an ASIC. In this test, the flip-flops for source-synchronous in both of the TR-side chip and the REC-side chip are first initialized to have their respective predetermined values. Next, a source-synchronous interface is driven in accordance with a clock with the same speed as that in actual operation, whereby a value (test data)

of the TR-side flip-flop is transmitted to the REC-side flip-flop. Thereafter, the result stored in the REC-side flip-flop is read out, and is then observed.

As described above, according to embodiments of the present invention, test data is transmitted in a source-synchronous interface at the same speed as that in actual operation, whereby an at-speed test is performed. A method in which a JTAG_TDR is shared may be applied to flip-flops for source-synchronous to be used in the test, in some cases.

As methods for implementing source-synchronous, there are: (a) a method in which the TR side transmits data and a clock with a half-cycle time interval therebetween; and (b) a method in which the TR side transmits data and a clock on the same clock edge. Of these, in the (b) method, in many cases, the timings of a clock edge and data transmission are caused to be different from each other in a manner that a synchronous clock is delayed by $\pi/2$ (90°) by using a delay means, such as a DDL (Digital Delay Line) circuit (hereinafter, a mechanism for delaying a clock by $\pi/2$ is referred to as a DDL), in the REC-side chip, whereby the data is latched to a flip-flop in accordance with this synchronous clock.

As a method for setting initial values (test data) in flip-flops for source-synchronous, there is a method for setting an initial value in accordance with a set/reset signal by using set/reset flip-flops as the flip-flops for source-synchronous. Moreover, in the case where source-synchronous is implemented by means of the above (b) method, a method in which a TR-side flip-flop is caused to also serve as a JTAG_TDR (that is, in which an initial value is set in a TR-side flip-flop by using a scheme of shifting data in accordance with JTAG) can be employed. Hence, three types of circuit configurations can be assumed to be employed for performing the test of the present invention. Hereinafter, the present invention will be described by providing first to third embodiments that correspond to these circuit configurations.

For the convenience of description, reference numerals as denoted below may be used in the following description: F1-F4, F11-F14, F21-F24 . . . flip flop; 11 . . . PLL circuit; 12 . . . PLL controller; 13 . . . 2-pulse generator; 14, 21 . . . TAP controller; 15, 22 . . . instruction register; 23 . . . DDL circuit; and 24 . . . clock controller.

First Embodiment

According to a first embodiment of the present invention, a method in which the TR side transmits data and a clock with a half-cycle time interval there-between is employed as a method for implementing source-synchronous.

FIG. 1 is a demonstrative diagram showing a configuration of a source-synchronous circuit according to the first embodiment. In FIG. 1, a chip A is a TR-side chip, and a chip B is a REC-side chip. Although only circuit sections that are for source-synchronous are shown in FIG. 1, it is to be understood that both of the chips A and B are provided respectively with system circuits. Note that, the differences between the chips A and B shown in FIG. 1 are merely for illustrating whether each of the chips A and B is the TR-side chip or the REC-side chip. In other words, each chip in an ASIC serves as the chip A or the chip B depending on the status (TR side or REC side) of the chip in the source-synchronous interface.

Figure 8:
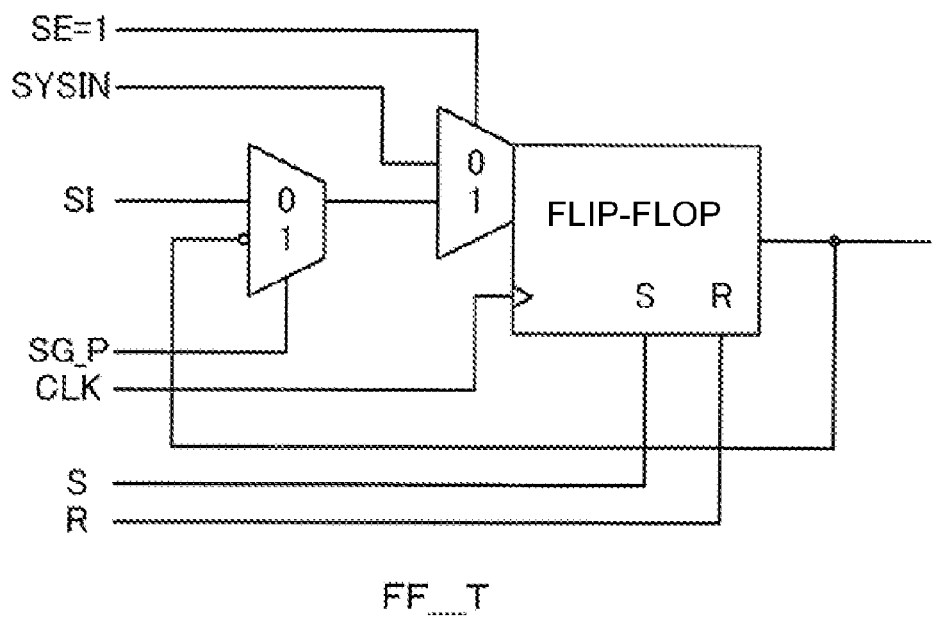
FIG. 8 is a diagram showing a circuit configuration of a TR-side flip-flop used in the embodiment.
Figure 9:
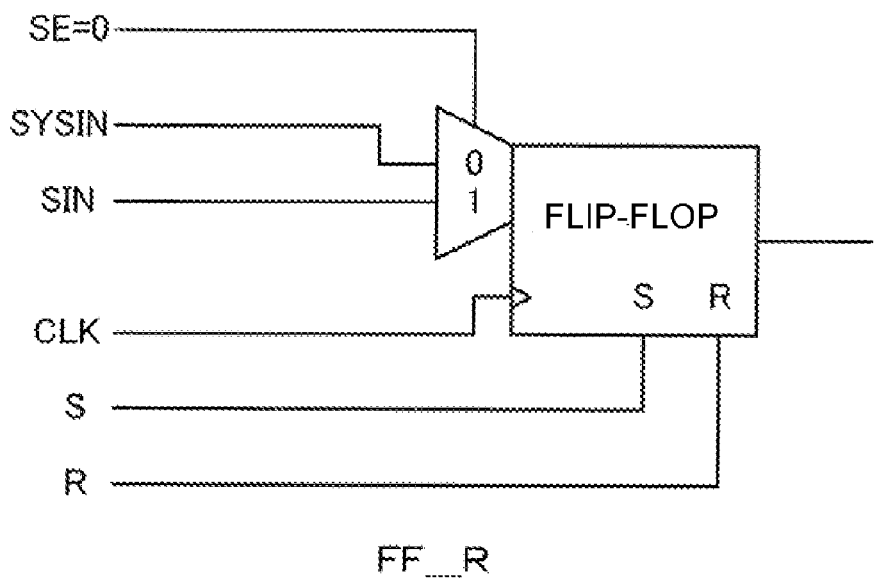
FIG. 9 is a diagram showing a circuit configuration of a REC-side flip-flop used in the embodiment.
Figure 10:
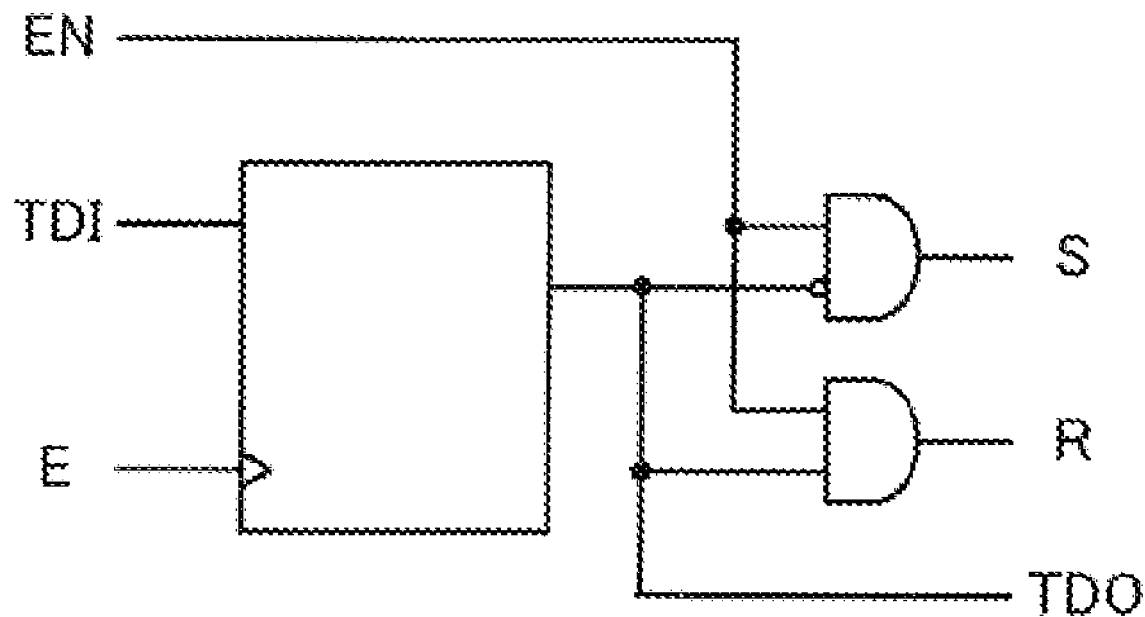
FIG. 10 is a diagram showing a circuit configuration of a JTAG_TDR used in the embodiment.

In the chip A, FF_T denotes a TR-side flip-flop. In this embodiment, the TR-side flip-flop is a set/reset flip-flop, the configuration of which is shown in FIG. 8. On the other hand, in the chip B, FF_R denotes a REC-side flip-flop. The REC-side flip-flop is also a set/reset flip-flop, the configuration of which is shown in FIG. 9. TDR_FF in the chips A and B denotes a JTAG_TDR, the configuration of which is shown in FIG. 10.

Figure 2:
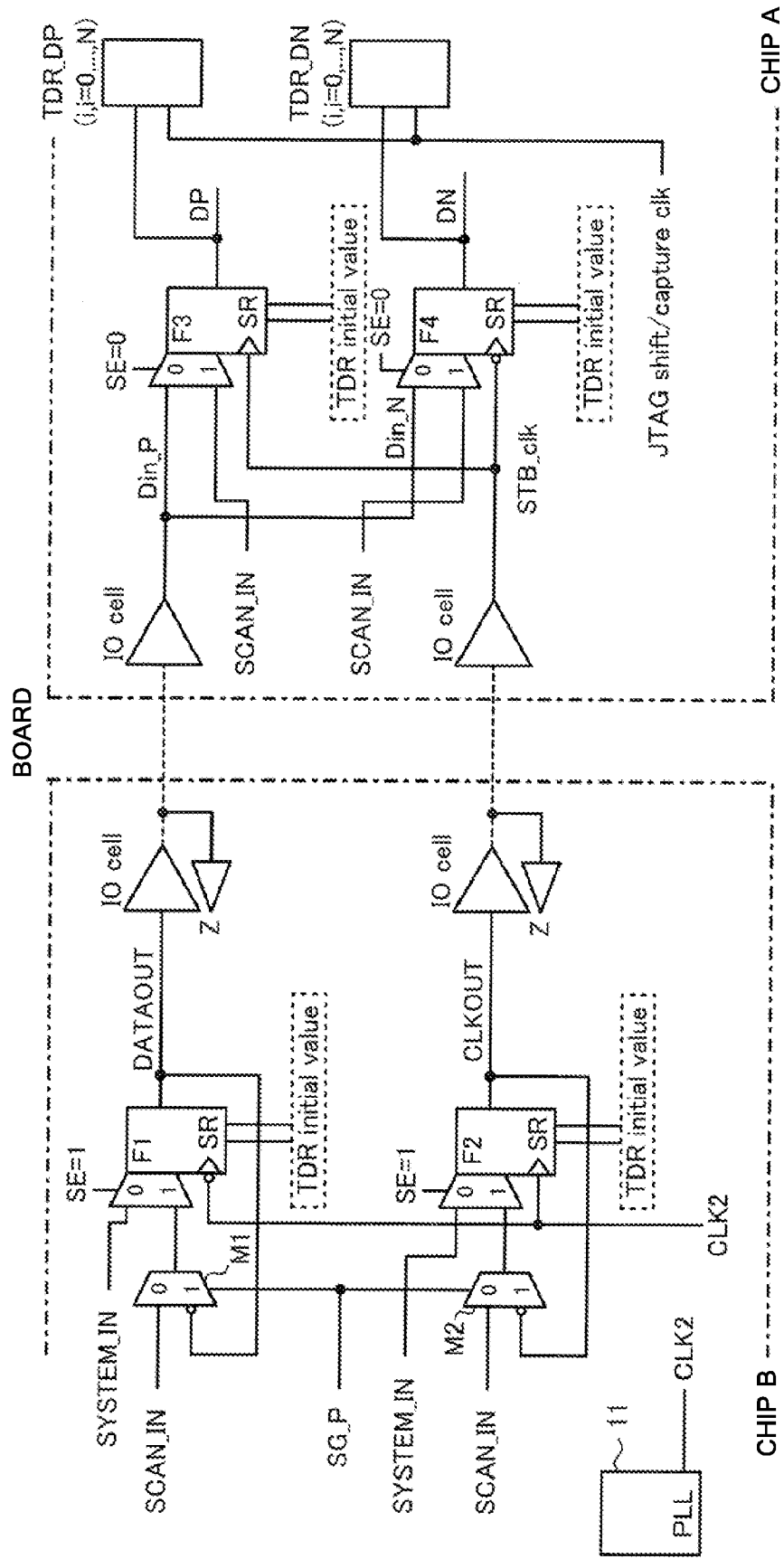
FIG. 2 is a diagram showing basic circuit elements for source-synchronous that are targets of the embodiment, in the circuit shown in FIG. 1.

FIG. 2 is a diagram showing basic circuit elements for source-synchronous that are a target of this embodiment. In FIG. 2, as flip-flops for source-synchronous, a flip-flop F1 for data transmission and a flip flop F2 for synchronous clock transmission are shown in the chip A (TR side), and flip-flops F3 and F4 for data reception are shown in the chip B (REC side). Of the REC-side flip-flops F3 and F4, the flip-flop F3 captures data transmitted from the flip-flop F1, on the rising edge of a synchronous clock transmitted from the flip-flop F2. The flip-flop F4, on the other hand, captures data transmitted from the flip-flop F1, on the falling edge of the synchronous clock transmitted from the flip-flop F2.

In FIG. 2, a single flip-flop F1, a single flip-flop F3 and a single flip-flop F4 are provided to a single flip-flop F2 for synchronous clock transmission. However, in an actual circuit, several flip-flops F1 are provided to a single flip-flop F2 for synchronous clock transmission, and flip-flops F3 and F4 are provided in the chip B in a manner that the number of the flip-flops F3 and the number of the flip-flops F4 each correspond to the number of the flip-flops F1 (see FIG. 1). Furthermore, several sets of such flip-flops F1 to F4 are provided in the chips A and B. For example, assume that the chips A and B include four sets of flip-flops F1 to F4, while eight flip-flops F1, eight flip-flops F3 and eight flip-flops F4 are provided to a single flip-flop F2 in each set. In such a case, the data transmission rate between the chips A and B is 32 bits (=8 bits×4)/clock edge.

In addition, in the chip A, the plurality of TR-side flip-flops F1 and F2 form a scan chain for manufacturing tests, and are each connected to an input terminal (scan in) and an output terminal (scan out) provided in the chip A. Similarly, in the chip B, the REC-side flip-flops F3 and F4 form a scan chain, and are each connected to an input terminal (scan in) and an output terminal (scan out) provided in the chip B. Each of the flip-flops F1, F2, F3 and F4 is set/reset in response to the output from a corresponding one of the TDR_FFs, which are each a JTAG_TDR (see FIG. 1). Furthermore, F1, F2, F3 and F4 are flip-flops for a MUXSCAN design. At the time of testing, F1 and F2 take a selection signal SE="1" while F3 and F4 take a selection signal SE="0." This also applies to FIGS. 13 and 18, which illustrate other embodiments to be described later.

The flip-flops F1 and F2 of the chip A will be described further. A value (test data) is set in the TR-side flip-flop F1 for data transmission by the control of the corresponding TDR_FF. Then, the flip-flop F1 inverts an output of its own in response to a control signal SG_P="1" inputted by a multiplexer M1, and inputs the inverted output again, thereafter outputting the retained value (DATAOUT) on the falling edge of a clock signal CLK2 from a PLL (Phase-Locked Loop) circuit 11.

By contrast, an initial value is set in the TR-side flip-flop F2 for synchronous clock transmission by the control of the corresponding TDR_FF. Then, the flip-flop F2 inverts an output of its own in response to a control signal SG_P="1" inputted by a multiplexer M2, and inputs the inverted output again, thereafter outputting the retained value as a synchronous clock (CLKOUT) by inputting a clock signal CLK2 from the PLL circuit 11 without inverting it. With this configuration, the output DATAOUT of the flip-flop F1 and the output CLKOUT of the flip-flop F2 are performed with a half-cycle time interval there-between.

Here, the clock signal CLK2 outputted from the PLL circuit 11 is a clock signal having the same frequency as that of an operation clock controlling operation of the chip A in actual operation.

Next, the flip-flops F3 and F4 of the chip B will be described further. An initial value is set in the REC-side flip-flop F3 for data reception by the control of the corresponding TDR_FF. Thereafter, CLKOUT, which is received from the chip A, is inputted to the flip-flop F3 as an operation clock STB_clk without being inverted. In accordance with this operation clock STB_clk, the flip-flop F3 captures DATAOUT, which is received from the chip A. The value (test data) of DATAOUT is thus outputted from the flip-flop F3 (DP), and is subsequently latched to a TDR_DP for observation.

By contrast, an initial value is set in the flip-flip F4, which is the other REC-side flip-flop for data reception, by the control of the corresponding TDR_FF. Thereafter, the synchronous clock CLKOUT, which is received from the chip A, is inputted to the flip-flop F4 as an operation clock STB_clk while being inverted. In accordance with this operation clock STB_clk, the flip-flop F4 captures DATAOUT, which is received from the chip A. The value of the DATAOUT (test data) is thus outputted from the flip-flop F4 (DN), and is subsequently latched to a TDR_DN for observation.

Figure 3:
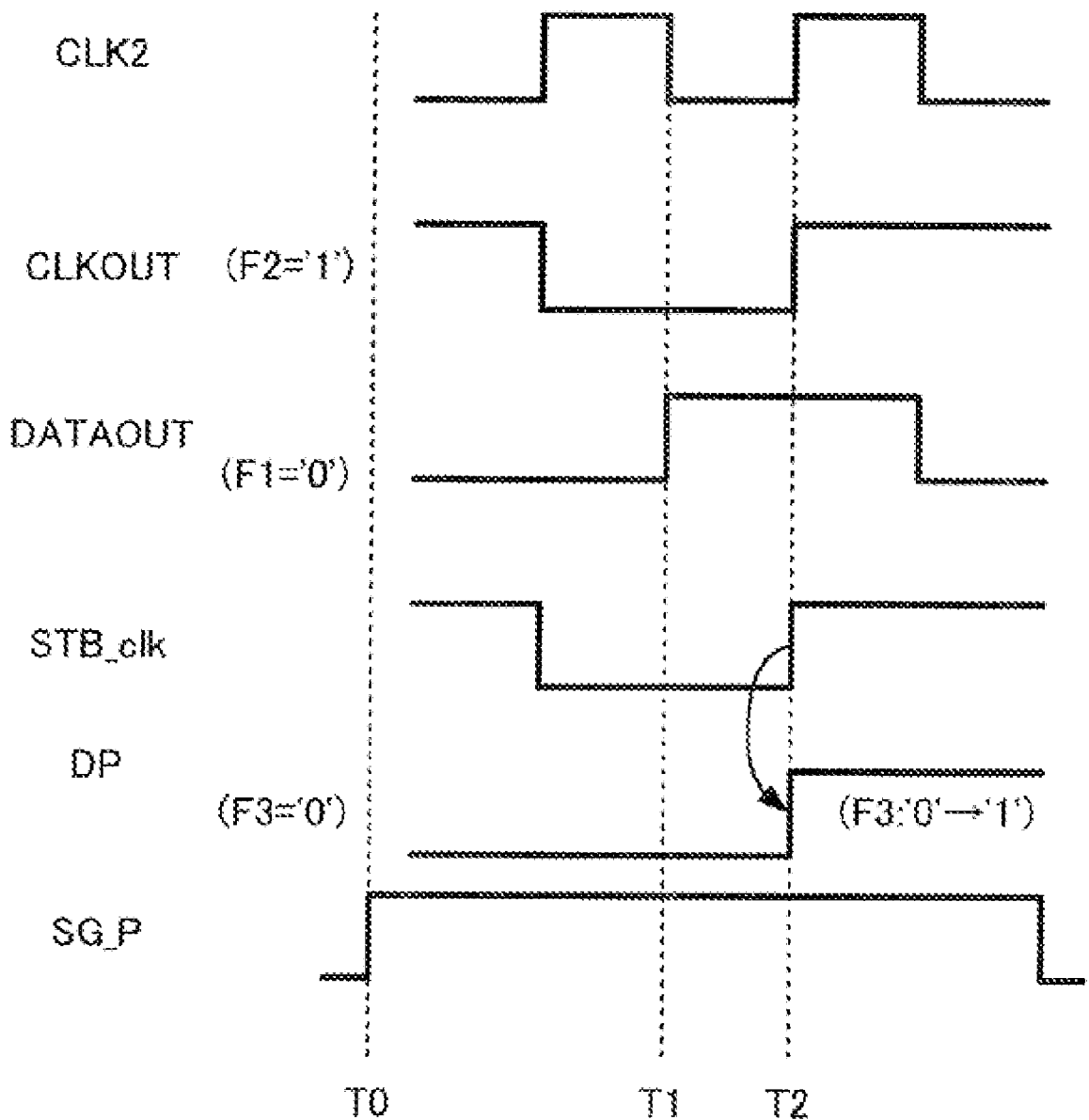
FIG. 3 is a diagram showing signal waveforms in a flip-flop F3 shown in FIG. 2.

FIG. 3 is a diagram showing signal waveforms in the flip-flop F3. On the rising edge of the first one of two clock signals CLK2 from the PLL circuit 11 of the chip A, the synchronous clock (CLKOUT) is outputted from the flip-flop F2, and the STB_clk falls. Then, on the falling edge of this first clock signal CLK2, the test data (DATAOUT) is outputted from the flip-flop F1. Subsequently, on the rising edge of the second clock signal CLK2, the outputting of the synchronous clock is terminated, and the STB_clk rises, whereby the value of the test data is captured by the flip-flop F3 of the chip B (DP). Here, (F1="0") shown in the drawing indicates that F1 is initialized to "0" by the corresponding TDR_FF. This also applies to the following description.

Figure 4:
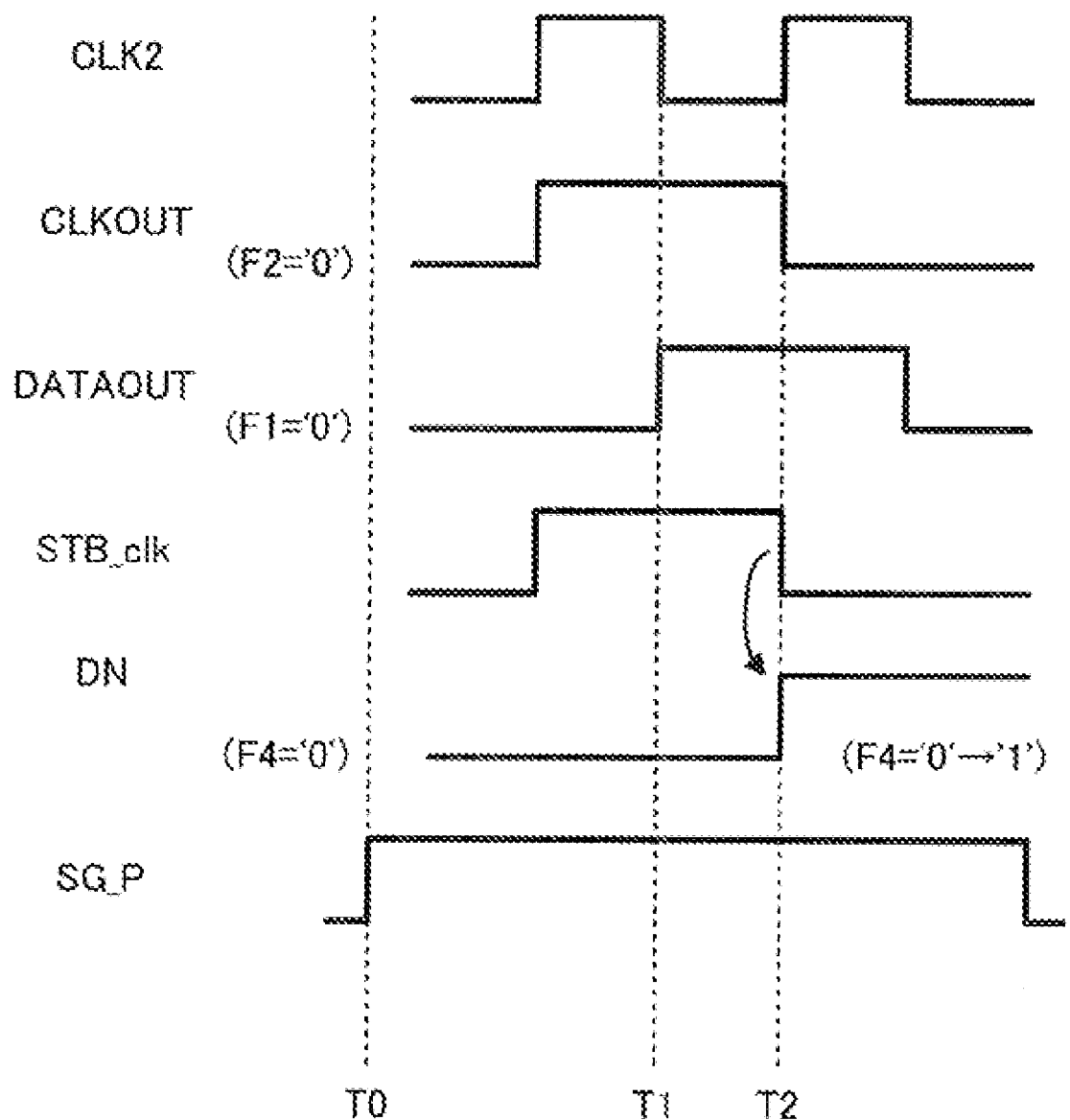
FIG. 4 is a diagram showing signal waveforms in a flip-flop F4 shown in FIG. 2.

FIG. 4 is a diagram showing signal waveforms in the flip-flop F4. On the rising edge of the first one of two clock signals CLK2 from the PLL circuit 11 of the chip A, the synchronous clock (CLKOUT) is outputted from the flip-flop F2, and the STB_clk rises. Then, on the falling edge of this first clock signal CLK2, the test data (DATAOUT) is outputted from the flip-flop F1. Subsequently, on the rising edge of the second clock signal CLK2, the outputting of the synchronous clock is terminated, and the STB_clk falls, whereby the value of the test data is captured by the flip-flop F4 of the chip B (DN).

Next, a method of setting initial values in the flip-flops F1 to F4 for source-synchronous in this embodiment will be described.

Figure 5:
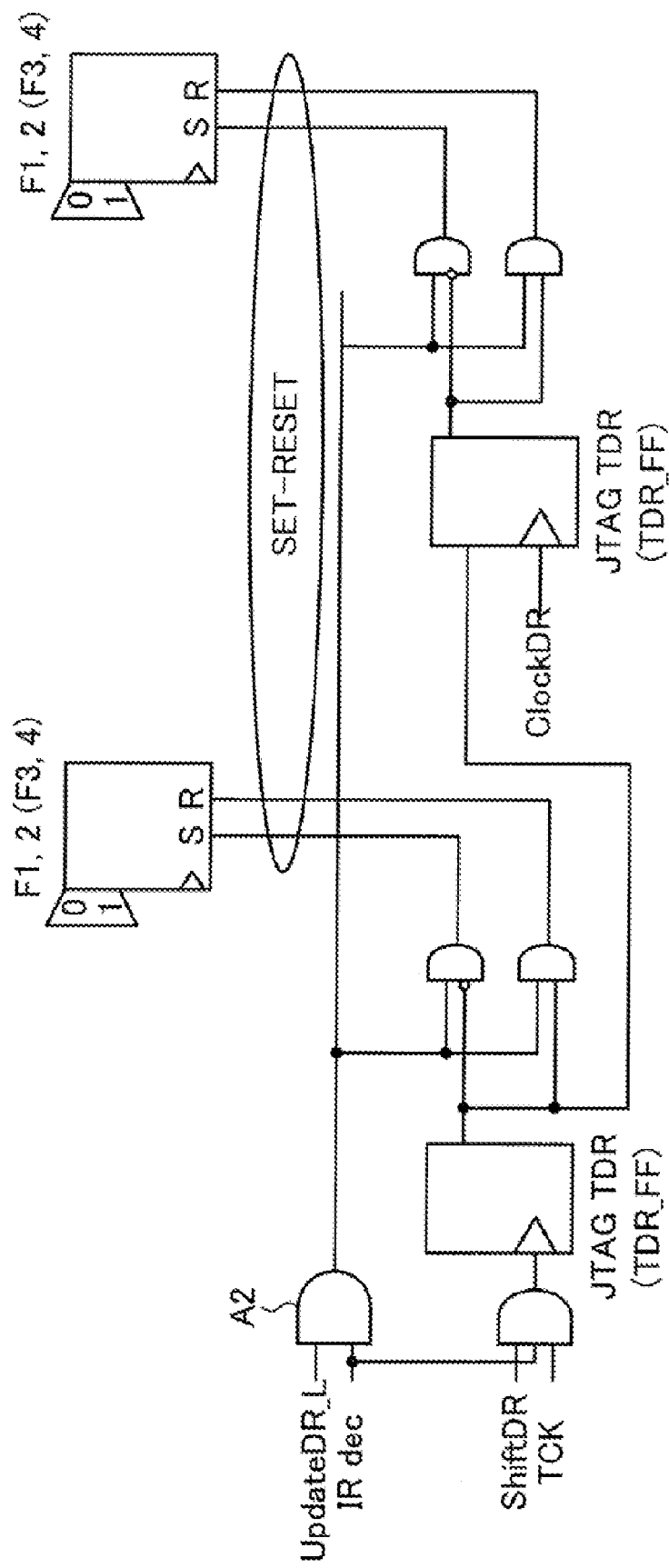
FIG. 5 is a diagram showing a configuration of a circuit for initializing flip-flops of a chip in the embodiment.
Figure 11:
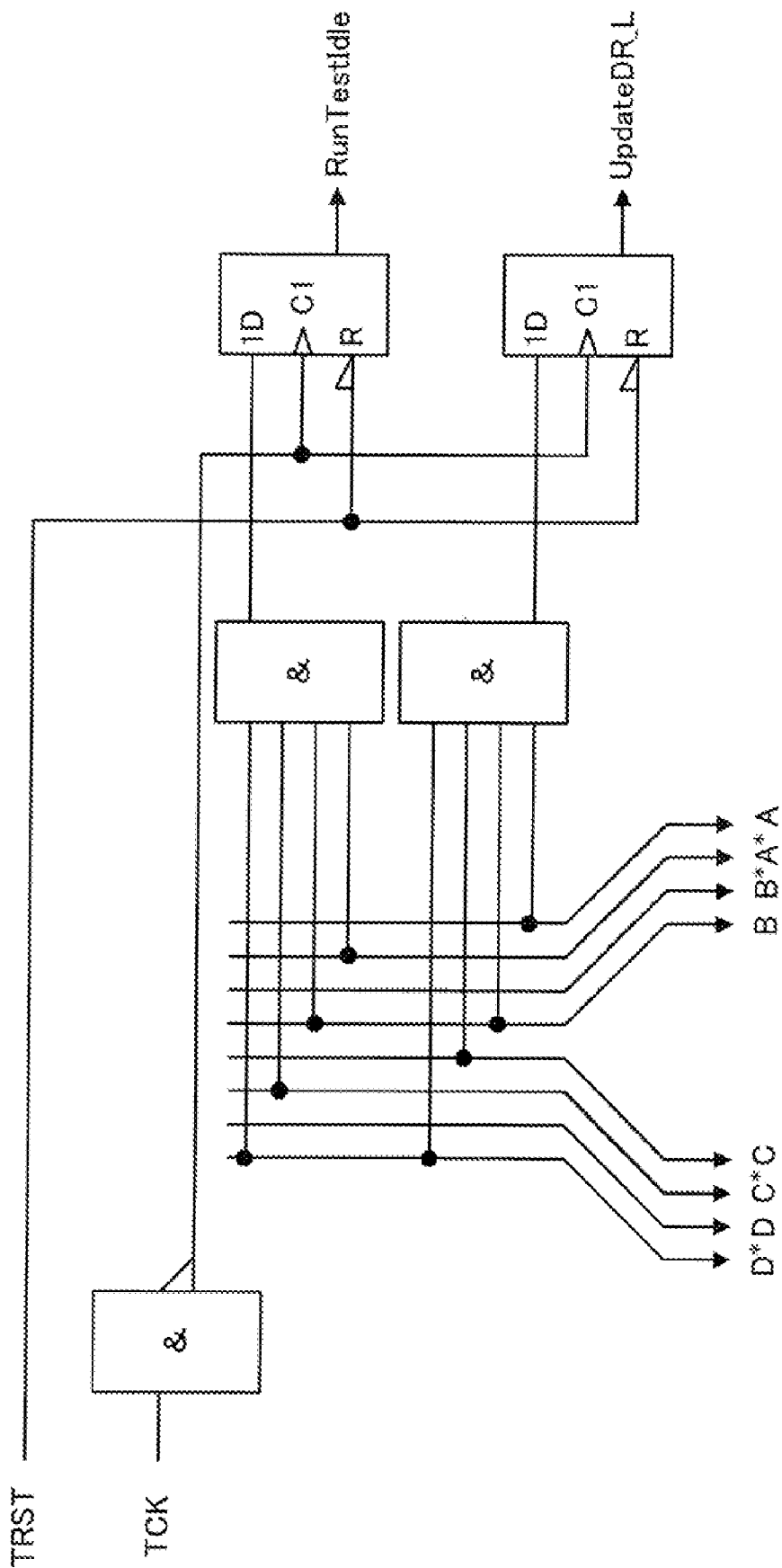
FIG. 11 is a diagram illustrating signals UpdateDR_L and RunTestIdle used in the embodiment.

FIG. 5 is a diagram showing a configuration of a circuit for initializing the flip-flops F1 and F2 of the chip A. The set/reset flip-flop shown in the drawing is either the flip-flop F1 or the flip-flop F2 of the chip A shown in FIG. 2. In FIG. 5, firstly, a value is stored in the TDR_FF. Then, when UpdateDR_L="1," the flip-flops F1 and F2 are set or reset in accordance with the value stored in the TDR_FF. The signal, UpdateDR_L, is generated as shown in FIG. 11. This also applies to the following description. In the example shown in the drawing, the flip-flops F1 and F2 are each reset when the value in the corresponding TDR_FF is "1," while being set when the value in the corresponding TDR_FF is "0."

Hereinabove, the description has been given of the method of initializing the flip-flops F1 and F2 of the chip A. However, in this embodiment, the flip-flops F3 and F4 of the chip B are similarly configured, so that the flip-flops F3 and F4 are each set or reset by the corresponding TDR_FF of the chip B. Accordingly, the notation, F1, F2 (F3, F4), is used in the drawing.

With reference to FIG. 1 again, a description will be given of the relation of connection at the chip level including flip-flops for source-synchronous on which the test according to this embodiment is performed.

Firstly, refer to the TR-side chip A. The chip A includes, in addition to the above-mentioned FF_Ts and TDR_FFs: the PLL circuit 11 and a PLL controller 12 for this test, as an operation-clock transmitting unit for transmitting operation clocks; a 2-pulse generator 13 for extracting two pulses from operation clocks transmitted from the PLL circuit 11, and for then outputting the pulses; a TAP controller 14 for controlling JTAG; and an instruction register (IR) 15. The outputs from the TAP controller 14 and the instruction register 15 are each provided to the TDR_FFs, FF_Ts, 2-pulse generator 13 and the like, via an instruction decoder as well as gates A1, A2 and A3.

The PLL controller 12 controls the PLL circuit 11 so that the PLL circuit 11 can perform transmission with the same frequency as that in actual operation after a bit string (hereinafter, a test bit) in a JTAG instruction assigned to this test is stored in the instruction register 15.

The AND gate A1 provides a TCK to the corresponding TDR_FF when a test bit is stored in the instruction register 15, and concurrently when ShiftDR="1."

The AND gate A2 provides, to each FF_T through the corresponding TDR_FF, a control signal for setting or resetting the FF_T when a test bit is stored in the instruction register 15, and concurrently when UpdateDR_L="1." Whether the FF_Ts are to be set or reset depends on the values set in the corresponding TDR_FFs, as described above. In this manner, the initial values of the FF_Ts are determined.

The AND gate A3 provides, to each FF_T, a control signal SG_P for setting the inside of the FF_T in a loop state, and also provides, to the 2-pulse generator 13, a trigger signal for extracting two pulses from the output of the PLL circuit 11, when a test bit is stored in the instruction register 15, and concurrently when RunTestIdle="1" (see FIG. 11).

Next, refer to the REC-side chip B. The chip B includes, in addition to the above-mentioned FF_Rs and TDR_FFs: a TAP controller 21 for controlling JTAG; and an instruction register 22. The outputs from the TAP controller 21 and the instruction registers 22 are each provided to the TDR_FFs and the like via an instruction decoder and gates A4 and A5.

The AND gate A4 provides, to the multiplexers M1 and M2, a control signal for causing the multiplexers M1 and M2 to select data indicating "1," when a test bit is stored in the instruction register 22, and then, when ShiftDR="1." By causing the multiplexers M1 and M2 to select data indicating "1," a scan is performed in a TDI (test data in)-TDO (test data out) path in accordance with a test clock TCK, whereby a value is set in each of the TDR_FFs.

The AND gate A5 provides, to the TDR_FFs, a control signal for setting or resetting the FF_Rs, when a test bit is stored in the instruction register 22, and concurrently when UpdateDR_L="1." Whether the FF_Rs are to be set or reset depends on the values set in the TDR_FFs, as described above. In this manner, the initial values of the FF_Rs are determined. In addition, the TAP controller 21 provides, to the TDR_FFs, a clock signal ClockDR for controlling operation of the TDR_FFs.

Next, a description will be given of operations in the test using the circuit with the above-described configuration.

Figure 6:
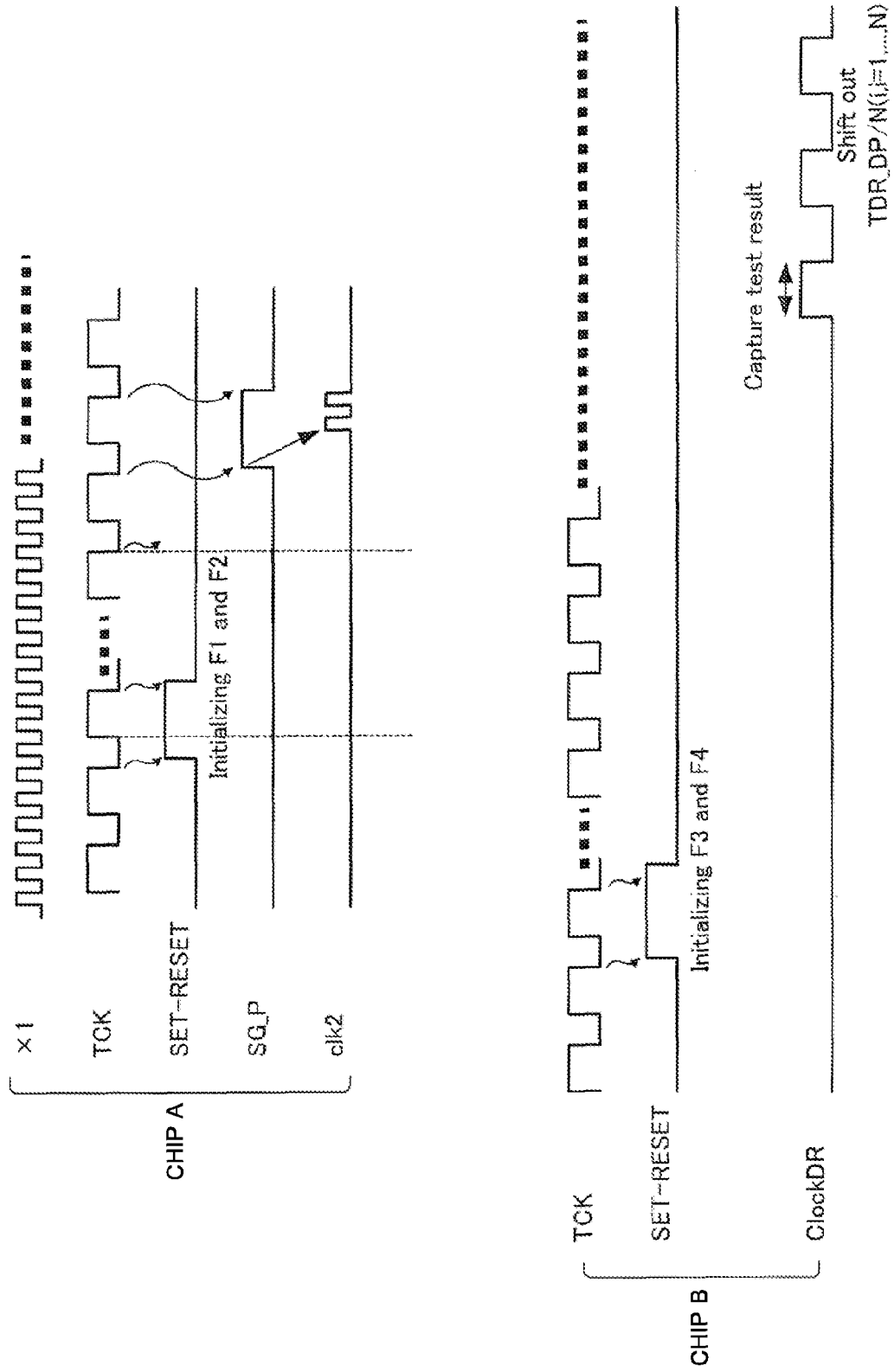
FIG. 6 is a diagram showing signal waveforms during test execution according to the embodiment.
Figure 7:
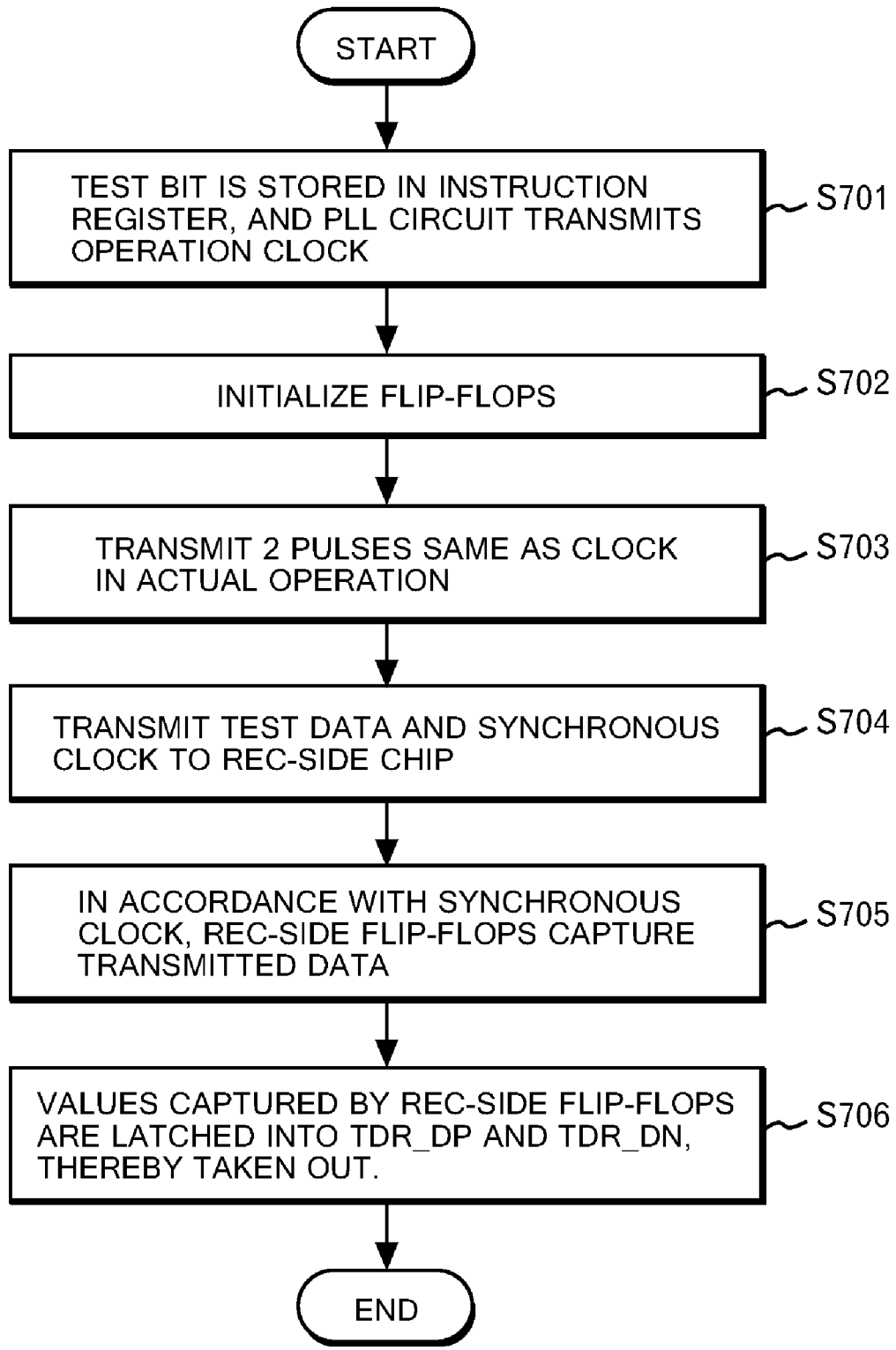
FIG. 7 is a flow chart showing a schematic flow of a test of the embodiment.

FIG. 6 is diagrams showing signal waveforms in the chips A and B during test execution, and FIG. 7 is a flowchart showing a schematic flow of the test.

The test of this embodiment mainly consists of three phases: a phase of setting initial values in (both TR-side and REC-side) flip-flops for source-synchronous; a phase of driving a source-synchronous interface at the same speed as actual operation; and a phase of taking out the result of the test.

As shown in FIG. 7, in the test of this embodiment, first, a test bit is stored in each of the instruction registers 15 and 22 of the chips A and B. The PLL circuit 11 of the chips A and B is thus triggered to transmit an operation clock (Step 701). Thereafter, flip-flops for source-synchronous (FF_Ts and FF_Rs in FIG. 1, and F1 to F4 in FIG. 2) are each initialized to an arbitrary value (Step 702). This flip-flop initialization can be performed by means of a method that conforms to the manner of JTAG 1149 standard, as mentioned above. Referring to FIG. 6, it is found that, in the chip A, the flip-flops F1 and F2 are each initialized in accordance with the value set in the corresponding TDR_FF, and similarly that, in the chip B, the flip-flops F3 and F4 are each initialized in accordance with the value set in the corresponding TDR_FF.

Subsequently, triggered by RunTestIdle="1" of the TR-side chip A, the 2-pulse generator 13 transmits two pulses out of the output from the PLL circuit 11, the two pulses having the same speed as that of a clock in actual operation (Step 703). Referring to FIG. 6, it is found that a control signal SG_P for causing the FF_Ts to be in a loop state is outputted, and, at this timing, clock signals CLK2 for two pulses are outputted. Note that, RunTestIdle is generated as shown in FIG. 11.

Then, in accordance with the two pulses, the flip-flops F1 and F2 respectively transmit the test data retained in the flip-flop F1 and a synchronous clock to the REC-side chip B (Step 704). The flip-flops F3 and F4 of the chip B capture the data transmitted from the flip-flop F1 of the chip A in accordance with the synchronous clock transmitted from the flip-flop F2 (Step 705).

Thereafter, in the REC-side chip B, the values captured by the flip-flops F3 and F4 are latched respectively to the TDR_DP and the TDR_DN in response to a clockDR. The latched values are then taken out from the TDOs to be observed (Step 706). This data can be taken out from the TDOs in accordance with a signal ClockDR provided from the TAP controller 14 by means of a method that conforms to the manner of JTAG 1149 standard.

In this way, test data is transmitted between TR-side flip-flops and REC-side flip-flops, all of which are for source-synchronous, at the same speed as that in actual operation. By evaluating the values (test result) captured by the REC side, a board-level at-speed test can be performed on the source-synchronous interface.

Second Embodiment

According to a second embodiment of the present invention, a method in which the TR side transmits data and a clock on the same clock edge is employed as the method of implementing source-synchronous, and concurrently TR-side flip-flops are set or reset, in accordance with the values of TDR_FFs, to be initialized.

Figure 12:
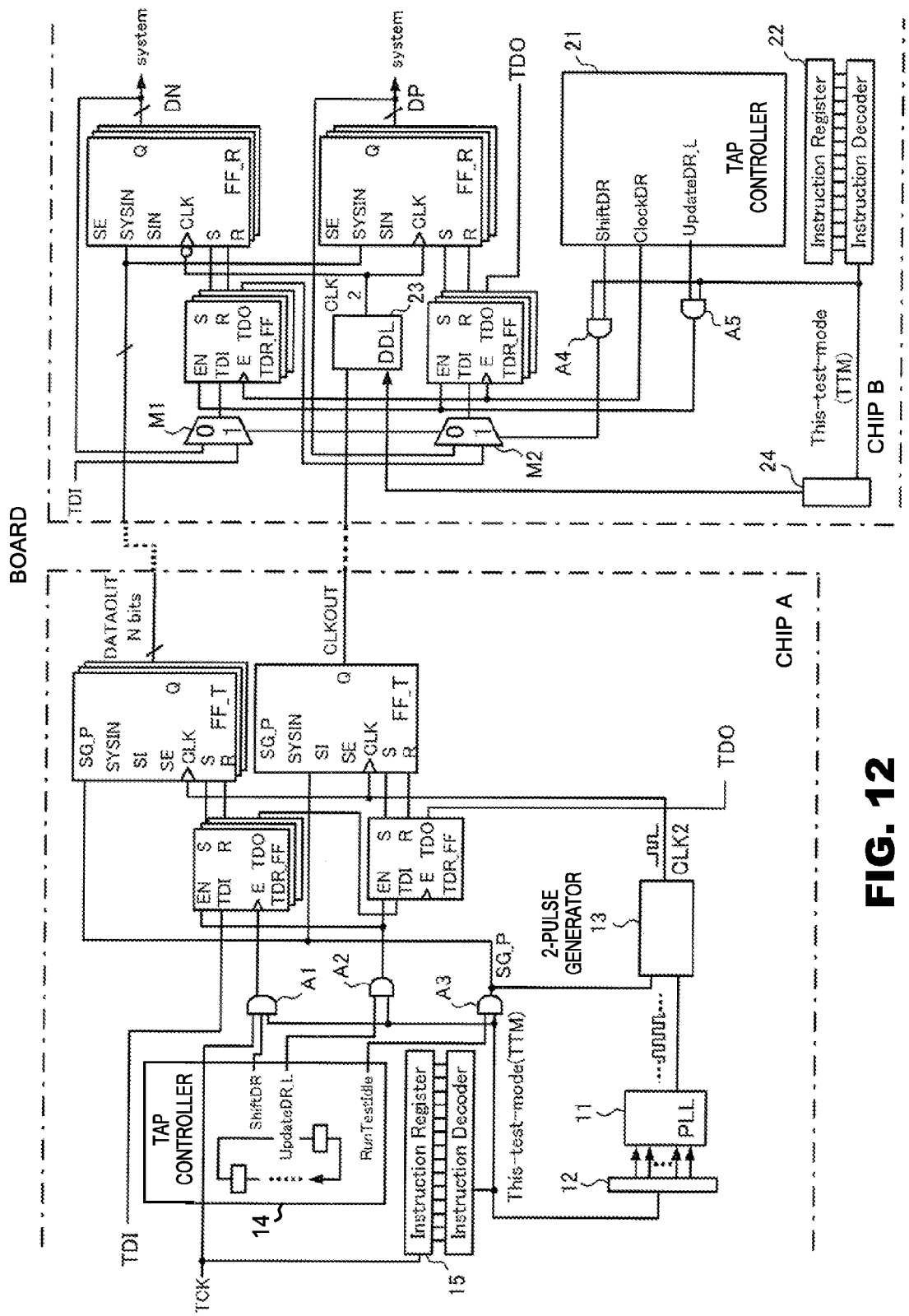
FIG. 12 is a demonstrative diagram showing a configuration of a source-synchronous circuit according to a second embodiment of the present invention.

FIG. 12 is a demonstrative diagram showing a configuration of a source-synchronous circuit according to the second embodiment. In FIG. 12, a chip A is a TR-side chip while a chip B is a REC-side chip. Although only circuit sections that are for source-synchronous are shown in FIG. 12, it is to be understood that both of the chips A and B are provided respectively with system circuits. Note that, the differences between the chips A and B shown in FIG. 12 are merely for illustrating whether each of the chips A and B is the TR-side chip or the REC-side chip. In other words, each chip in an ASIC serves as the chip A or the chip B depending on the status (TR side or REC side) of the chip in the source-synchronous interface. In the chips A and B, FF_T denotes a TR-side flip-flop, FF_R denotes a REC-side flip-flop, and TDR_FF denotes a JTAG_TDR. The configurations of these are similar to those of the first embodiment respectively shown in FIGS. 8, 9 and 10.

Figure 13:
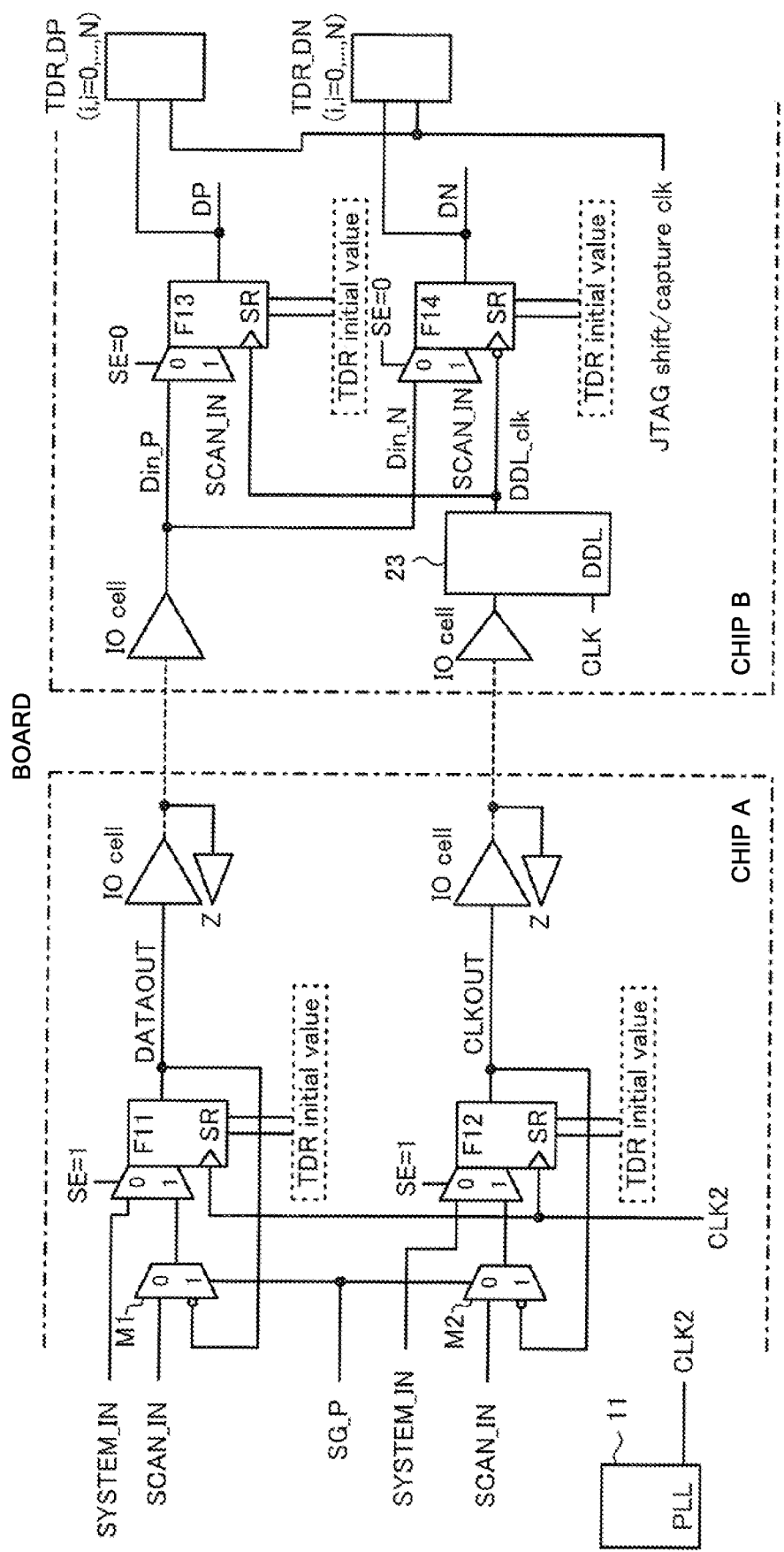
FIG. 13 is a diagram showing basic circuit elements for source-synchronous that are targets of the embodiment, in the circuit shown in FIG. 12.

FIG. 13 is a diagram showing basic circuit elements for source-synchronous that are a target of this embodiment. In FIG. 13, as flip-flops for source-synchronous, a flip-flop F11 for data transmission and a flip flop F12 for synchronous clock transmission are shown in the chip A (TR side), while flip-flops F13 and F14 for data reception are shown in the chip B (REC side). Of the REC-side flip-flops F13 and F14, the flip-flop F13 captures data transmitted from the flip-flop F11, on the rising edge of a synchronous clock transmitted from the flip-flop F12. The flip-flop F14, on the other hand, captures data transmitted from the flip-flop F11, on the falling edge of the synchronous clock transmitted from the flip-flop F12.

In FIG. 13, a single flip-flop F11, a single slip-flop F13 and a single flip-flop F14 are provided to a single flip-flop F12 for synchronous clock transmission. However, in an actual circuit, several flip-flops F11 are provided to a single flip-flop F12 for synchronous clock transmission, and flip-flops F13 and F14 are provided in the chip B in a manner that the number of the flip-flops F13 and the number of the flip-flops F14 each correspond to the number of the flip-flops F11 (see FIG. 12). Furthermore, several sets of such flip-flops F11 to F14 are provided in the chips A and B.

In addition, in the chip A, the plurality of TR-side flip-flops F11 and F12 form a scan chain for manufacturing tests, and are each connected to an input terminal (scan in) and an output terminal (scan out) provided in the chip A. Similarly, in the chip B, the REC-side flip-flops F13 and F14 form a scan chain, and are each connected to an input terminal (scan in) and an output terminal (scan out) provided in the chip B. Each of the flip-flops F11, F12, F13 and F14 is set/reset in response to the output from a corresponding one of the TDR_FFs (see FIG. 12).

The flip-flops F11 and F12 of the chip A will be described further. A value (test data) is set in the TR-side flip-flop F11 for data transmission by the control of the corresponding TDR_FF. Then, the flip-flop F11 inverts an output of its own in response to a control signal SG_P="1" inputted by a multiplexer M1, and inputs the inverted output again, thereafter outputting the retained value (DATAOUT) by inputting a clock signal CLK2 from a PLL circuit 11 without inverting it.

By contrast, an initial value is set in the TR-side flip-flop F12 for synchronous clock transmission by the control of the corresponding TDR_FF. Then, the flip-flop F12 inverts an output of its own in response to a control signal SG_P="1" inputted by a multiplexer M2, and inputs the inverted output again, thereafter outputting the retained value as a synchronous clock (CLKOUT) by inputting a clock signal CLK2 from the PLL circuit 11 without inverting it. With this configuration, the output DATAOUT of the flip-flop F11 and the output CLKOUT of the flip-flop F12 are performed on the same clock edge.

Here, the clock signal CLK2 outputted from the PLL circuit 11 is an operation clock for controlling operation of the chip A in actual operation.

Next, the flip-flops F13 and F14 of the chip B will be described further. An initial value is set in the REC-side flip-flop F13 for data reception by the control of the corresponding TDR_FF. Thereafter, the cycle length of CLKOUT, which is received from the chip A, is delayed by $\pi/2$ in a DLL circuit 23, and then the delayed CLKOUT is inputted to the flip-flop F13 as an operation clock DDL_clk without being inverted. In accordance with this operation clock DDL_clk, the flip-flop F13 captures DATAOUT, which is received from the chip A. The value (test data) of DATAOUT is thus outputted from the flip-flop F13 (DP), and is subsequently latched into a TDR_DP for observation.

By contrast, an initial value is set in the flip-flop F14, which is the other flip-flop for data reception, by the control of the corresponding TDR_FF. Thereafter, the cycle length of the synchronous clock CLKOUT, which is received from the chip A, is delayed by $\pi/2$ in the DLL circuit 23, so that the synchronous clock CLKOUT is set as an operation clock DDL_clk. The operation clock DDL_clk is then inputted to the flip-flop F14 while being inverted. In accordance with this operation clock DDL_clk, the flip-flop F14 captures DATAOUT, which is received from the chip A. The value of the DATAOUT (test data) is thus outputted from the flip-flop F14 (DN), and is subsequently latched into a TDR_DN for observation.

Figure 14:
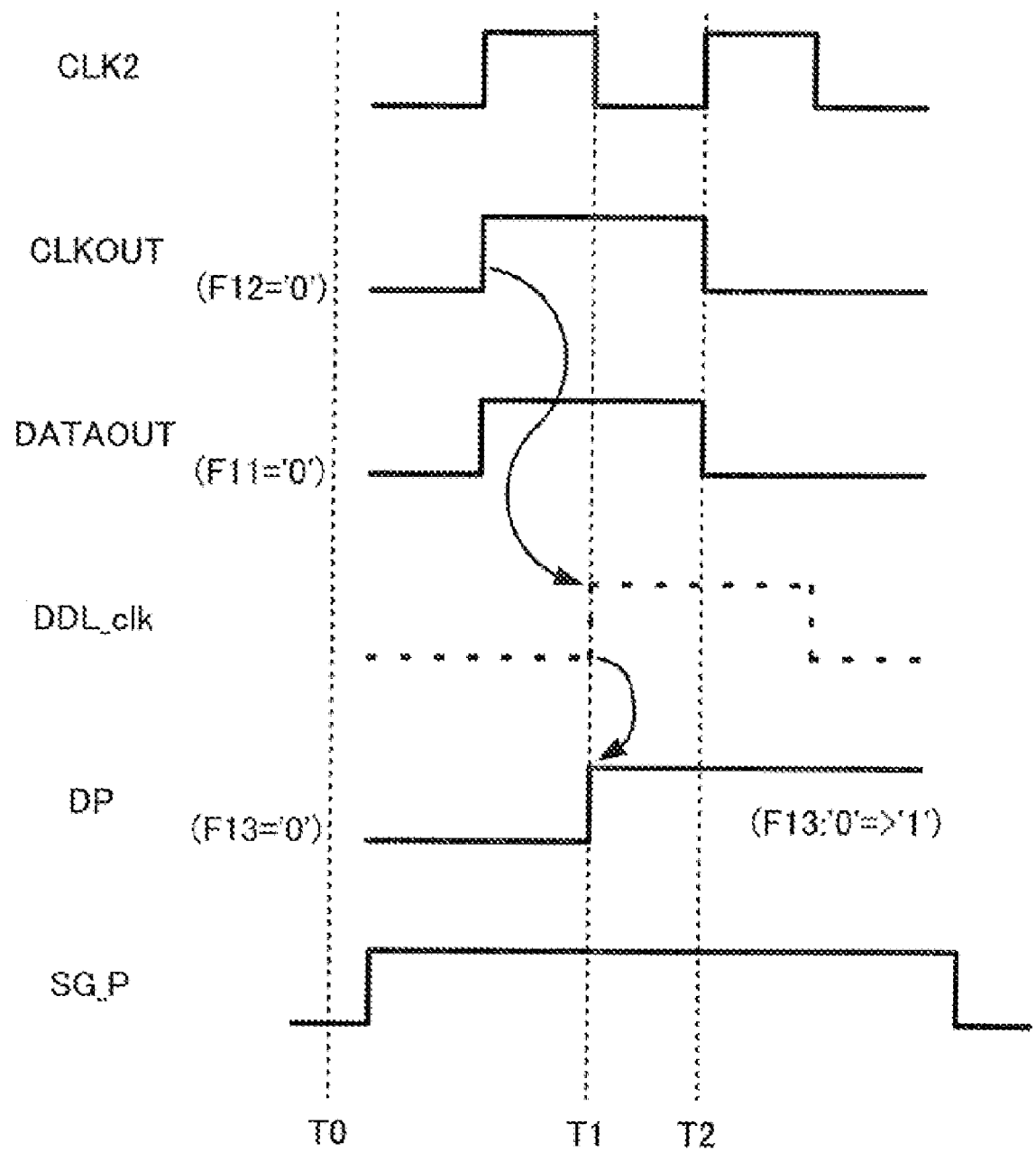
FIG. 14 is a diagram showing signal waveforms in a flip-flop F13 shown in FIG. 13.

FIG. 14 is a diagram showing signal waveforms in the flip-flop F13. On the rising edge of the first clock signal CLK2 of the two clock signals CLK2 from the PLL circuit 11 of the chip A, the test data (DATAOUT) of the flip-flop F11 and the synchronous clock (CLKOUT) of the flip-flop F12 are outputted simultaneously. Then, the DDL_clk rises, delayed by $\pi/2$ cycle from this synchronous clock. As a consequence, the timing of the rising of the DDL_clk is shifted in the middle of the test data. In response to this rising of the DLL_clk, the value of the test data is captured by the flip-flop F13 of the chip B (DP).

Figure 15:
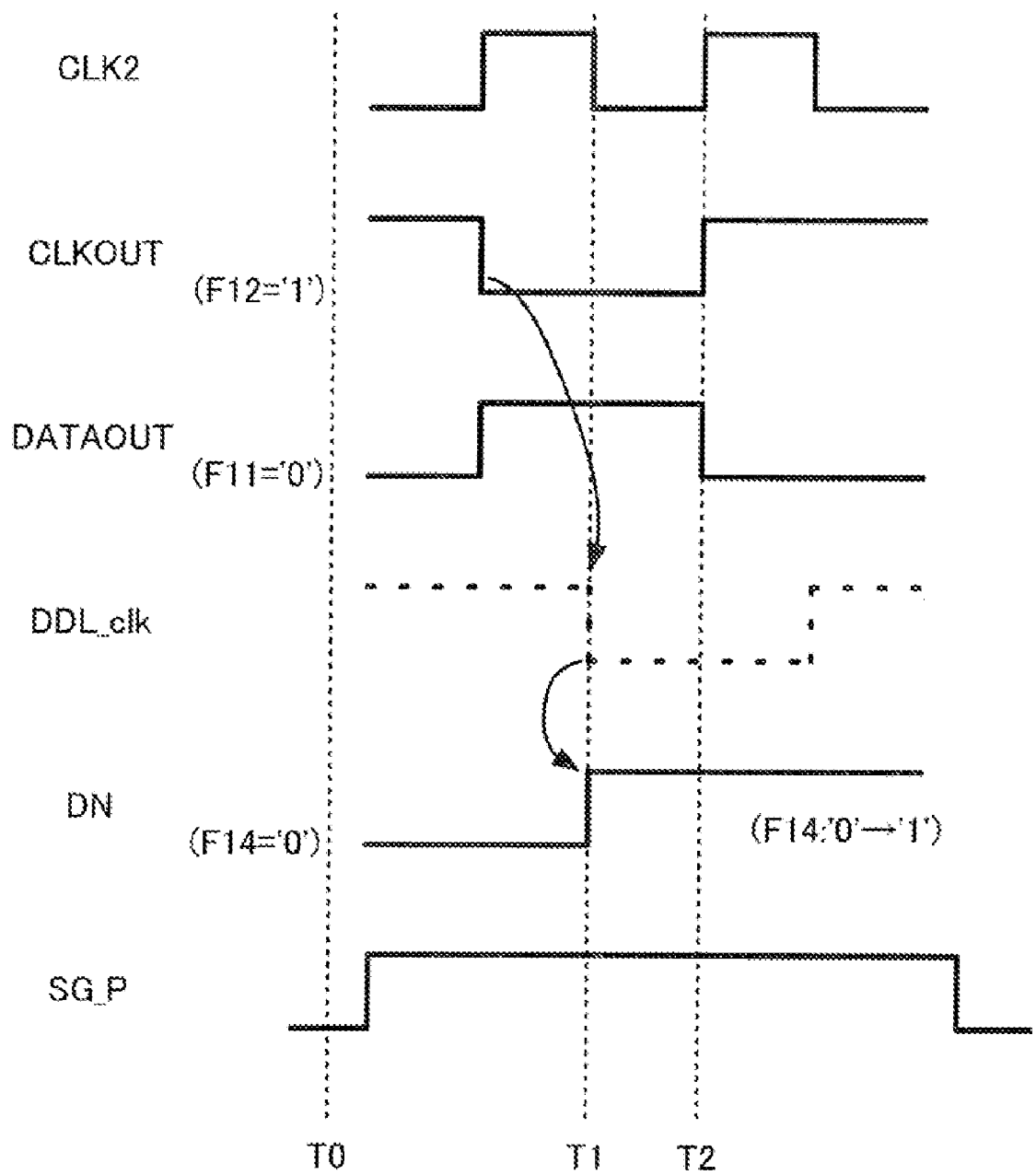
FIG. 15 is a diagram showing signal waveforms in a flip-flop F14 shown in FIG. 13.

FIG. 15 is a diagram showing signal waveforms in the flip-flop F14. On the rising edge of the first clock signal CLK2 of the two clock signals CLK2 from the PLL circuit 11 of the chip A, the test data (DATAOUT) of the flip-flop F11 and the synchronous clock (CLKOUT) of the flip-flop F12 are outputted simultaneously. Then, the DDL_clk falls, delayed by $\pi/2$ cycle from this synchronous clock. As a consequence, the timing of the falling of the DDL_clk is shifted in the middle of the test data. In response to this falling of the DLL_clk, the value of the test data is captured by the flip-flop F14 of the chip B (DN).

In this embodiment, the flip-flops F11 to F14 for source-synchronous are, as the flip-flops F1 to F4 of the first embodiment, set/reset in accordance with the outputs of the corresponding TDR_FFs as described above. Hence, an initial value is set in each of the flip-flops F11 to F14 by means of a method similar to that employed in the first embodiment, in the circuit configuration shown in FIG. 5.

With reference to FIG. 12 again, the relation of connection at the chip level including flip-flops for source-synchronous on which the test according to this embodiment is performed.

Firstly, refer to the TR-side chip A. The chip A includes, in addition to the above-mentioned FF_Ts and TDR_FFs: the PLL circuit 11 and a PLL controller 12, as an operation-clock transmitting unit for transmitting operation clocks; a 2-pulse generator 13 for extracting two pulses from operation clocks transmitted from the PLL circuit, and then for outputting the pulses; a TAP controller 14 for controlling JTAG; and an instruction register (IR) 15. The outputs from the TAP controller 14 and the instruction register 15 are each provided to the TDR_FFs, FF_Ts, 2-pulse generator 13 and the like, via gates A1, A2 and A3.

The PLL controller 12 controls the PLL circuit 11 so that the PLL circuit 11 can perform transmission with the same frequency as that in actual operation after a test bit is stored in the instruction register 15.

The AND gate A1 provides a TCK to the corresponding TDR_FF when a test bit is stored in the instruction register 15, and concurrently when ShiftDR="1."

The AND gate A2 provides, to each FF_T through the corresponding TDR_FF, a control signal for setting or resetting the FF_T when a test bit is stored in the instruction register 15, and concurrently when UptadteDR_L="1." Whether the FF_Ts are to be set or reset depends on the values set in the corresponding TDR_FFs, as described above. In this manner, the initial values of the FF_Ts are determined. At this event, the initial value of the FF_T, including the flip-flop F1 shown in FIG. 13, is set to serve as test data.

The AND gate A3 provides, to each FF_T, a control signal SG_P for setting the inside of the FF_T in a loop state, and also provides, to the 2-pulse generator 13, a trigger signal for extracting two pulses from the output of the PLL circuit 11, when a test bit is stored in the instruction register 15, and concurrently when RunTestIdle="1."

Next, refer to the REC-side chip B. The chip B includes, in addition to the above-mentioned FF_Rs and TDR_FFs: a TAP controller 21 for controlling JTAG; an instruction register 22; a DDL circuit 23 for delaying a synchronous clock; and a clock controller 24 for controlling the DDL circuit 23 and an unillustrated PLL circuit. The outputs from the TAP controller 21 and the instruction registers 22 are each provided to the TDR_FFs and the like via gates A4 and A5.

The clock controller 24 controls the DDL circuit 23 and the PLL circuit so that the DDL circuit 23 and the unillustrated PLL circuit can perform transmission with the same frequency as that in actual operation after a test bit is stored in the instruction register 22.

The AND gate A4 provides, to multiplexers M1 and M2, a control signal for causing the multiplexers M1 and M2 to select data indicating "1," when a test bit is stored in the instruction register 22, and concurrently when ShiftDR="1." By causing the multiplexers M1 and M2 to select data indicating "1," a scan is performed in a TDI (test data in)-TDO (test data out) path in accordance with a test clock TCK, whereby a value is set in each of the TDR_FFs.

The AND gate A5 provides, to each FF_R through the corresponding TDR_FF, a control signal for setting or resetting the FF_Rs, when a test bit is stored in the instruction register 22, and concurrently when UpdateDR_L="1." Whether the FF_Rs are to be set or reset depends on the values set in the TDR_FFs, as described above. In this manner, the initial values of the FF_Rs are determined.

The ClockDR of the TAP controller 21 provides a test clock TCK to the TDR_FFs when ShiftDR="1," or when CaptureDR="1." In accordance with the provided test clock TCK, a scan is performed in the TDI-TDO path, and also the data stored in the FF_Rs is captured by the TDR_FFs, for example.

The operations in the test performed in the circuit with the above-described configuration are approximately the same as those in the first embodiment described with reference to FIGS. 6 and 7.

The operations in the second embodiment are different in the following respects from those in the first embodiment.

Firstly, in the first embodiment, the output timing at which the test data is outputted from the flip-flop F1, and the output timing at which the synchronous clock is outputted from the flip-flop F2, have a half-cycle time interval there-between. By contrast, in the second embodiment, the output of the test data from the flip-flop F11 and the output of the synchronous clock from the flip-flop F12 are performed on the same clock edge.

Moreover, in Step 705 of FIG. 7, in the first embodiment, the flip-flops F3 and F4 capture the test data transmitted from the flip-flop F1, in accordance with the synchronous clock transmitted from the flip-flop F2. By contrast, in the second embodiment, since the clock edge on which the test data is outputted from the flip-flop F11, and the clock edge on which the synchronous clock is outputted from the flip-flop F12, are the same timing, the synchronous clock is delayed by $\pi/2$ in the DLL circuit 23. Then, the flip-flops F13 and F14 capture the test data in accordance with this delayed synchronous clock.

Third Embodiment

Similar to the second embodiment, in a third embodiment, a method in which the TR side transmits data and a clock on the same clock edge is employed as the method of implementing source-synchronous. In the third embodiment, however, description will be given of the case where initialization is performed by means of a method in which a value is set in a JTAG_TDR by allowing a TR-side flip-flop to play a role as a JTAG_TDR.

Figure 16:
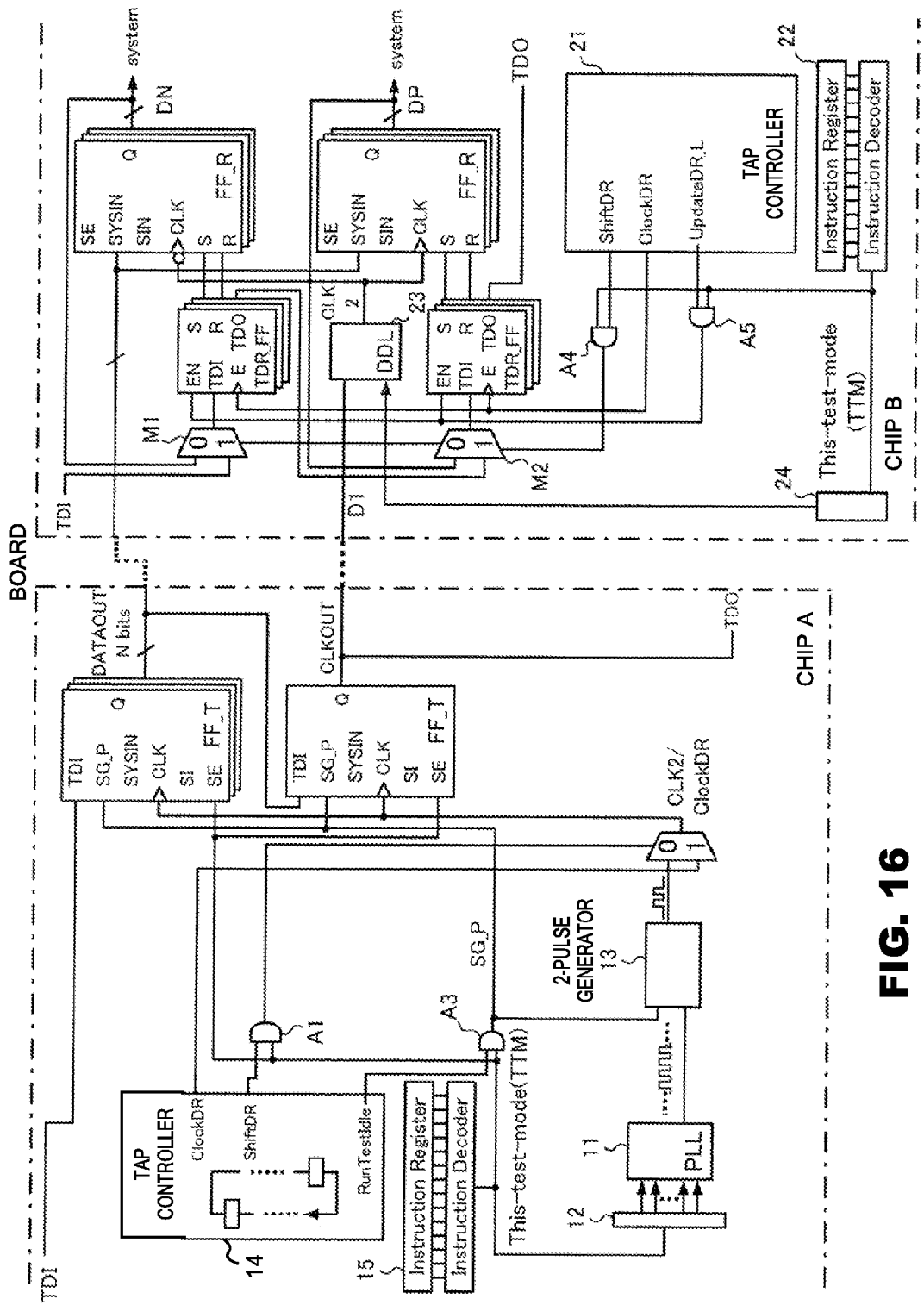
FIG. 16 is a demonstrative diagram showing a configuration of a source-synchronous circuit according to a third embodiment of the present invention.

FIG. 16 is a demonstrative diagram showing a configuration of a source-synchronous circuit according to the third embodiment. In FIG. 16, a chip A is a TR-side chip while a chip B is a REC-side chip. Although only circuit sections that are for source-synchronous are shown in FIG. 16, it is to be understood that both of the chips A and B are provided respectively with system circuits in an actual circuit. Note that, the differences between the chips A and B shown in FIG. 16 are merely for illustrating whether each of the chips A and B is the TR-side chip or the REC-side chip. In other words, each chip in an ASIC serves as the chip A or the chip B depending on the status (TR side or REC side) of the chip in the source-synchronous interface.

Figure 17:
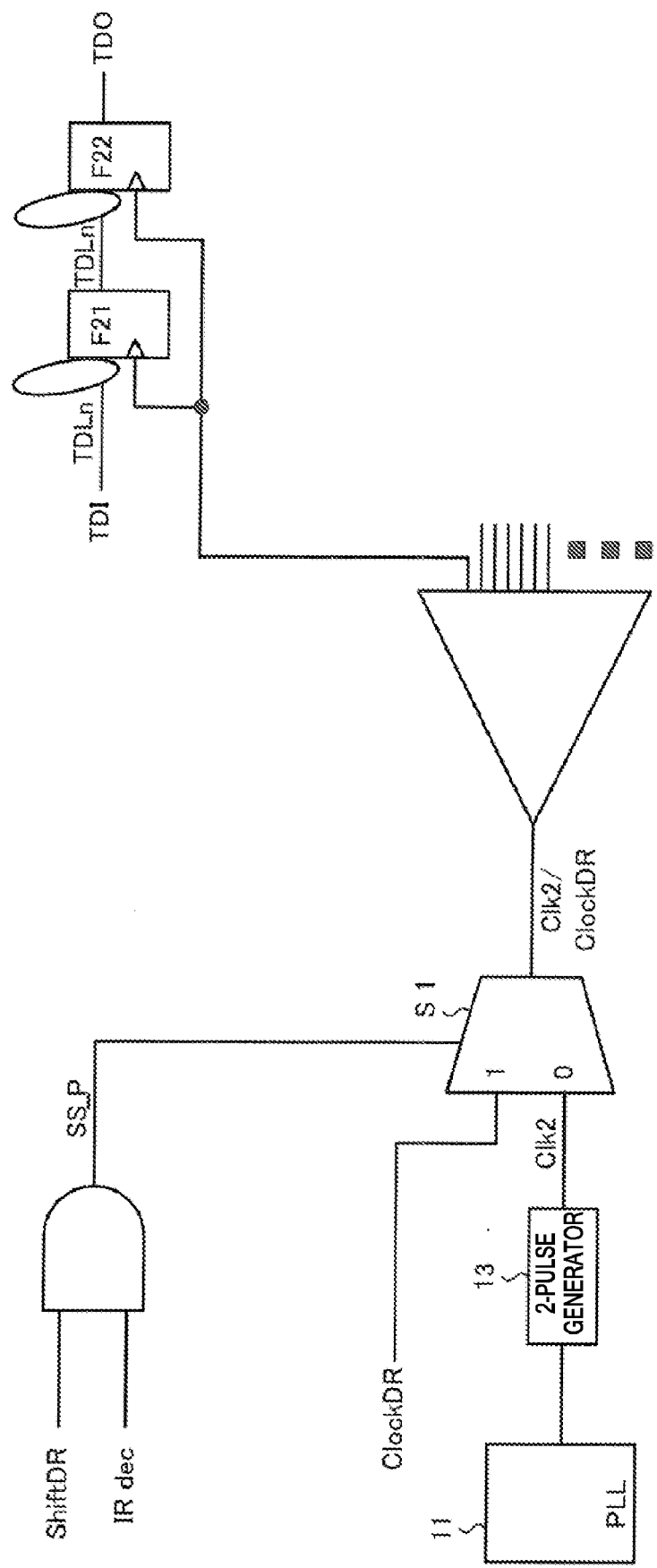
FIG. 17 is a diagram showing a circuit configuration of TR-side flip-flops used in the embodiment.

In the chips A and B, FF_T denotes a TR-side flip-flop, FF_R denotes a REC-side flip-flop, and TDR_FF denotes a JTAG_TDR. Since FF_Ts serve also as TDR_FFs in this embodiment, there is no TDR_FF in the chip A. The configuration of one of these TR-side flip-flops FF_Ts is shown in FIG. 17. The configurations of the FF_Rs and TDR_FFs of the chip B are similar to those in the first embodiment shown in FIGS. 9 and 10.

Figure 18:
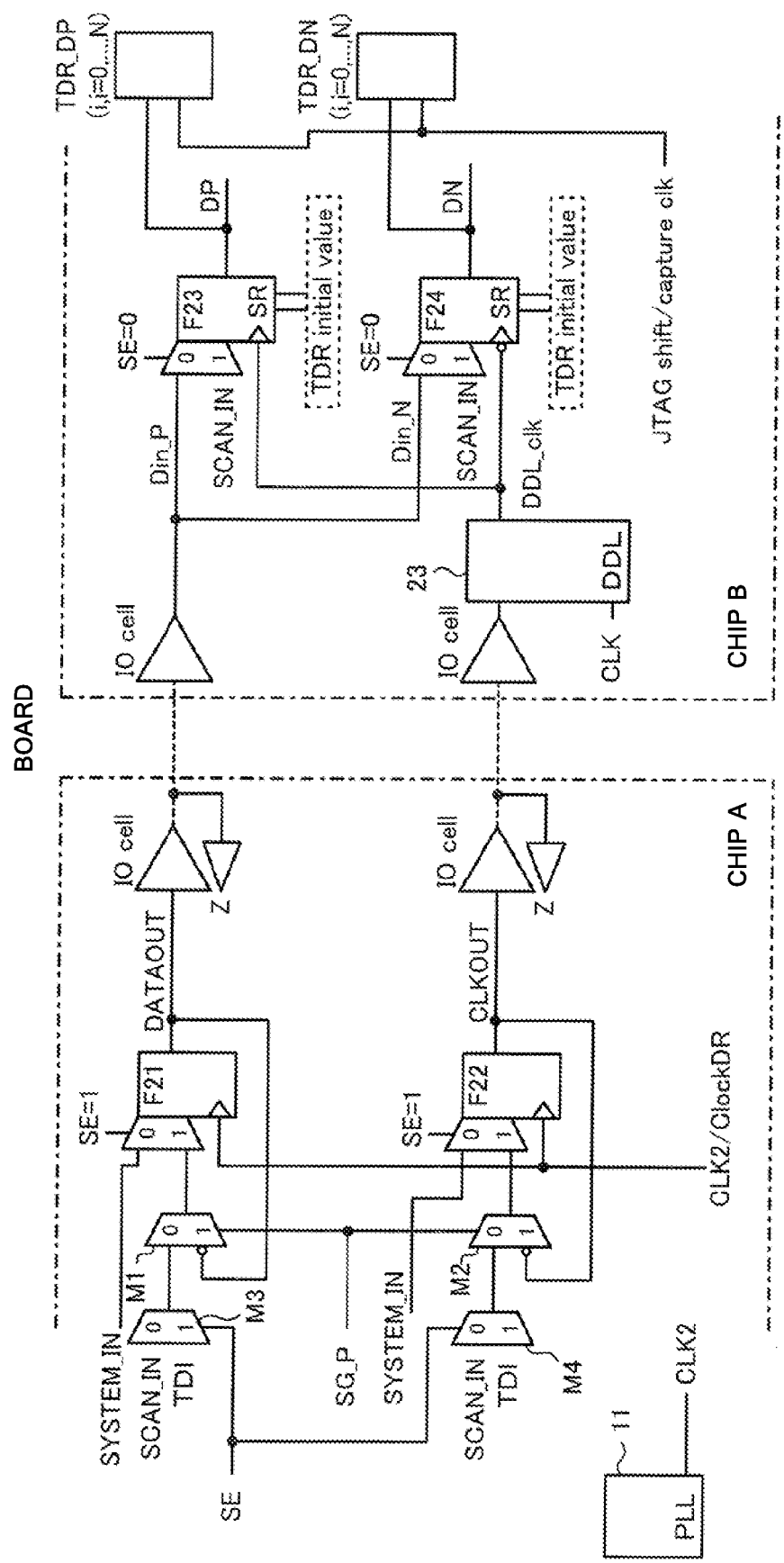
FIG. 18 is a diagram showing basic circuit elements for source-synchronous that are targets of the embodiment, in the circuit shown in FIG. 16.

FIG. 18 is a diagram showing basic circuit elements for source-synchronous that are a target of this embodiment. In FIG. 18, as flip-flops for source-synchronous, a flip-flop F21 for data transmission and a flip-flop F22 for synchronous clock transmission are shown in the chip A (TR side), while flip-flops F23 and F24 for data reception are shown in the chip B (REC side). Of the REC-side flip-flops F23 and F24, the flip-flop F23 captures data transmitted from the flip-flop F21, on the rising edge of a synchronous clock transmitted from the flip-flop F22. In addition, the flip-flop F24 captures data transmitted from the flip-flop F21 on the falling edge of the synchronous clock transmitted from the flip-flop F22.

In FIG. 18, a single flip-flop F21, a single flip-flop F23 and a single flip-flop F24 are provided to a single flip-flop F22 for synchronous clock transmission. However, in an actual circuit, several flip-flops F21 are provided to a single flip-flop F22 for synchronous clock transmission, and flip-flops F23 and F24 are provided in the chip B in a manner that the number of the flip-flops F23 and the number of the flip-flops F24 each correspond to the number of the flip-flops F21 (see FIG. 16). Furthermore, several sets of such flip-flops F21 to F24 are provided in the chips A and B.

In addition, in the chip A, the plurality of TR-side flip-flops F21 and F22 form a scan chain for manufacturing tests, and are each connected to an input terminal (scan in) and an output terminal (scan out) provided in the chip A. Similarly, in the chip B, the REC-side flip-flops F23 and F24 form a scan chain, and are each connected to an input terminal (scan in) and an output terminal (scan out) provided in the chip B. An initial value is set in each of the flip-flops F21 and F22 of this embodiment by performing a scan-shift on the data through the corresponding scan chain. Each of the flip-flops F23 and F24, on the other hand, is set/reset in response to the output of a corresponding one of the TDR_FFs (see FIG. 16).

The flip-flops F21 and F22 of the chip A will be described further. A value (test data) is set in the TR-side flip-flop F21 for data transmission via the scan path of the JTAG_TDR that is routed through the pins 1 and 0 respectively of the multiplexers M3 and M1. Then, the flip-flop F21 inverts an output of its own in response to a control signal SG_P inputted by a multiplexer M1, and inputs the inverted output again, while inputting the clock signal CLK2 from the PLL circuit 11 without inverting it, thereby outputting the retained value (DATAOUT).

By contrast, an initial value is set in the TR-side flip-flop F22 for synchronous clock transmission, via the scan path of the JTAG_TDR that is routed through the pins 1 and 0 respectively of the multiplexers M4 and M2. Then, the flip-flop F22 inverts an output of its own in response to a control signal SG_P inputted by a multiplexer M2, and inputs the inverted output again, while inputting the clock signal CLK2 from the PLL circuit 11 without inverting it, thereby outputting the retained value as a synchronous clock (CLKOUT). With this configuration, the output DATAOUT of the flip-flop F21 and the output CLKOUT of the flip-flop F2 are performed on the same clock edge.

Here, the clock signal CLK2 outputted from the PLL circuit 11 is an operation clock for controlling operation of the chip A in actual operation.

Next, the flip-flops F23 and F24 of the chip B will be described further. An initial value is set in the REC-side flip-flop F23 for data reception by the control of the corresponding TDR_FF. Thereafter, the cycle length of the CLKOUT, which is received from the chip A, is delayed by $\pi/2$ in a DLL circuit 23, and then the delayed CLKOUT is inputted to the flip-flop F23 as an operation clock DDL_clk without being inverted. In accordance with this operation clock DDL_clk, the flip-flop F23 captures DATAOUT, which is received from the chip A. The value of DATAOUT (test data) is thus outputted from the flip-flop F23 (DP), and is subsequently latched into a TDR_DP for observation.

By contrast, an initial value is set in the flip-flop F24, which is the other flip-flop for data reception, by the control of the corresponding TDR_FF. Thereafter, the cycle length of the synchronous clock CLKOUT, which is received from the chip A, is delayed by $\pi/2$ in the DLL circuit 23, so that the synchronous clock CLKOUT is set as an operation clock DDL_clk. The operation clock DDL_clk is then inputted to the flip-flop F24 while being inverted. In accordance with this operation clock DDL_clk, the flip-flop F24 captures DATAOUT, which is received from the chip A. The value of the DATAOUT (test data) is thus outputted from the flip-flop F24 (DN), and is subsequently latched into a TDR_DN for observation.

Figure 19:
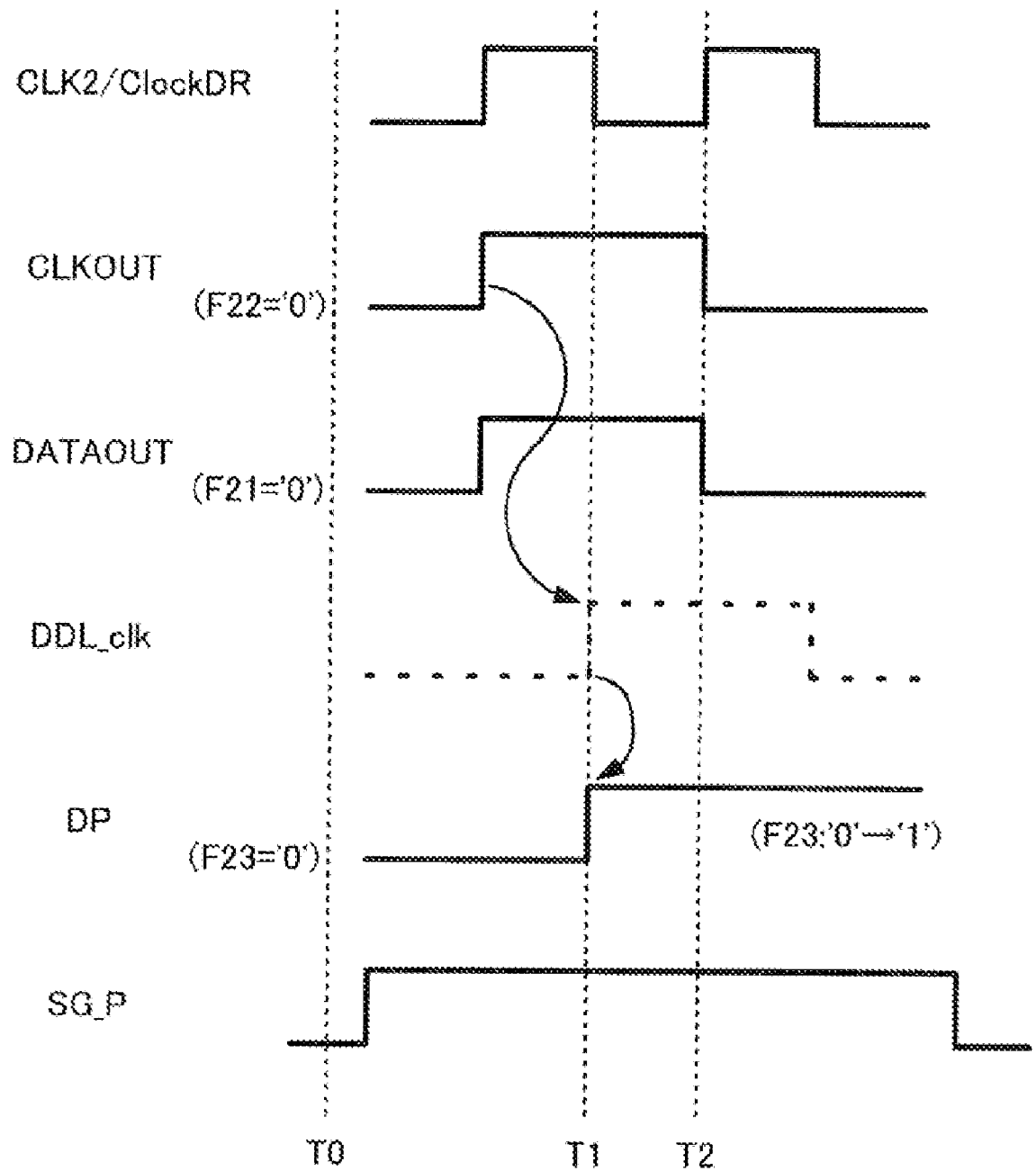
FIG. 19 is a diagram showing signal waveforms in a flip-flop F23 shown in FIG. 18.

FIG. 19 is a diagram showing waveforms in the flip-flop F23. On the rising edge of the first clock signal CLK2 of the two clock signals CLK2 from the PLL circuit 11 of the chip A, the test data (DATAOUT) of the flip-flop F21 and the synchronous clock (CLKLOUT) of the flip-flop F22 are outputted simultaneously. Then, the DDL_clk rises, delayed by π/2 cycle from this synchronous clock. As a consequence, the timing of the rising of the DDL_clk is shifted in the middle of the test data. In response to this rising of the DLL_clk, the value of the test data is captured by the flip-flop F23 of the chip B (DP).

Figure 20:
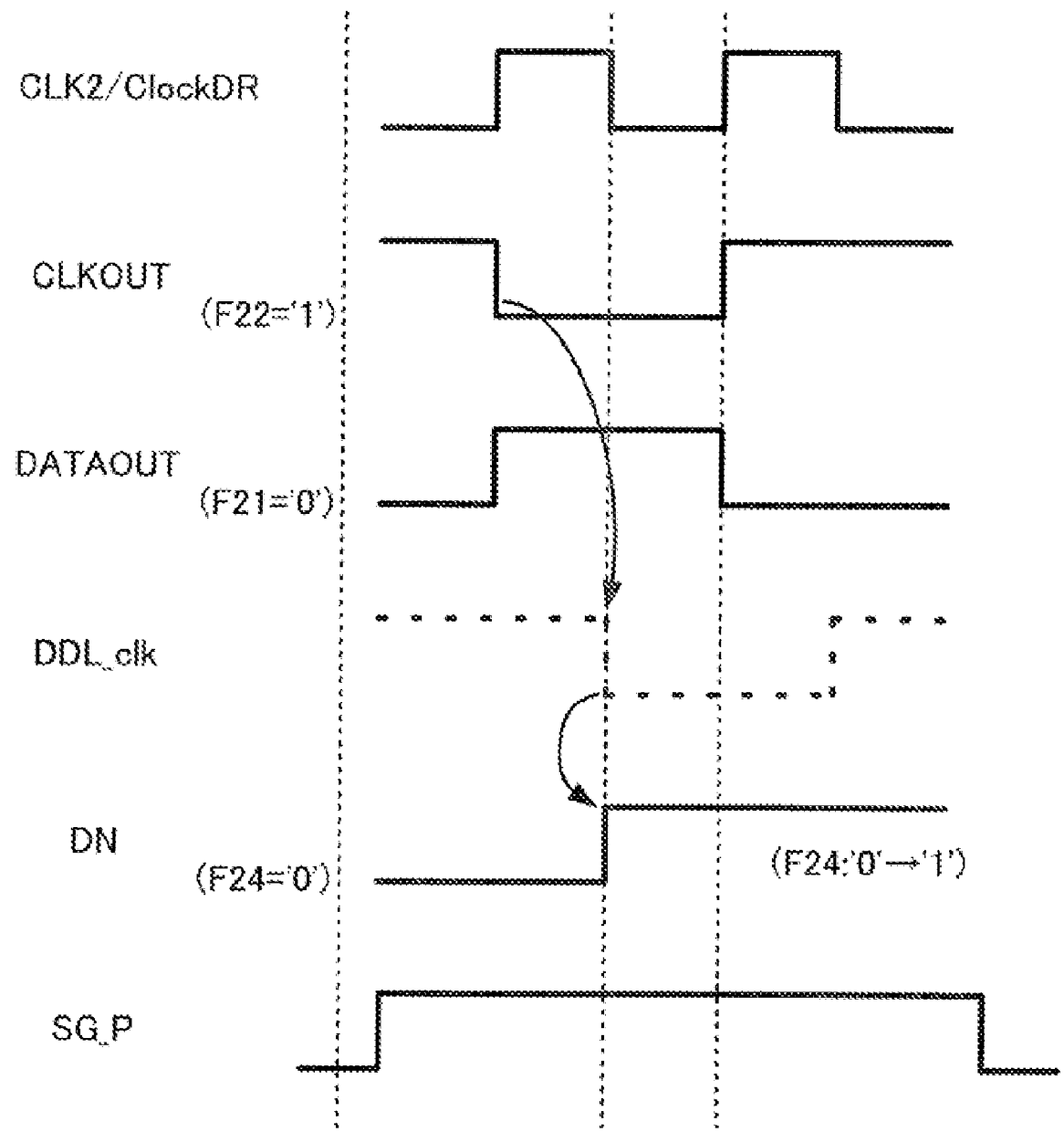
FIG. 20 is a diagram showing signal waveforms in a flip-flop F24 shown in FIG. 18.

FIG. 20 is a diagram showing signal waveforms in the flip-flop F24. On the rising edge of the first clock signal CLK2 of the two clock signals CLK2 from the PLL circuit 11 of the chip A, the test data (DATAOUT) of the flip-flop F21 and the synchronous clock (CLKOUT) of the flip-flop F22 are outputted simultaneously. Then, the DDL_clk falls, delayed by π/2 cycle from this synchronous clock. As a consequence, the timing of the falling of the DDL_clk is shifted in the middle of the test data. In response to this falling of the DLL_clk, the value of the test data is captured by the flip-flop F24 of the chip B (DN).

Next, a method of setting initial values in the flip-flops F21 to F24 for source-synchronous in this embodiment will be described.

FIG. 17 is a diagram showing a configuration of a circuit for initializing the flip-flops F21 and F22 of the chip A. In FIG. 17, when ShiftDR="1," a control signal SS_P is provided to a multiplexer S1, so that the ClockDR is selected to be provided to the flip-flops F21 and F22. In accordance with this signal ClockDR, data is inputted from the TDI (test data in) of JATG to the flip-flops F21 and F22, so that the flip-flops F21 and F22 are initialized.

By contrast, the flip-flops F23 and F24 of the chip B are set/reset, as in the case of the flip-flops F1 to F4 for source-synchronous in the first embodiment, in accordance with the outputs from the TDR_FFs. Hence, initial values are set in the flip-flops F23 and F24 by means of the same method as that employed in the first embodiment, in the circuit configuration shown in FIG. 5.

With reference to FIG. 16 again, a description will be given of the relation of connection at the chip level including flip-flops for source-synchronous on which the test according to this embodiment is performed.

Firstly, refer to the TR-side chip A. The chip A includes, in addition to the above-mentioned FF_Ts: the PLL circuit 11 and a PLL controller 12, as an operation-clock transmitting unit; a 2-pulse generator 13 for extracting two pulses from operation clocks transmitted from the PLL circuit 11, and for then outputting the pulses; a TAP controller 14 for controlling JTAG; and an instruction register (IR) 15. The outputs from the TAP controller 14 and the instruction register 15 are each provided to the FF_Ts, the 2-pulse generator 13 and the like, via gates A1 and A3.

The PLL controller 12 controls the PLL circuit 11 so that the PLL circuit 11 can perform transmission with the same frequency as that in actual operation after a test bit is stored in the instruction register 15.

The AND gate A1 provides a clock signal ClockDR to the TDR_FFs when a test bit is stored in the instruction register 15, and concurrently when ShiftDR="1." As a result, the FF_Ts are directly initialized.

The AND gate A3 provides, to the FF_Ts, a control signal SG_P for setting the inside of each of the FF_Ts in a loop state, and also provides, to the 2-pulse generator 13, a trigger signal for extracting two pulses from the output of the PLL circuit 11, when a test bit is stored in the instruction register 15, and concurrently when ShiftDR="1."

Next, refer to the REC-side chip B. The chip B includes, in addition to the above-mentioned FF_Rs and the TDR_FFs: a TAP controller 21 for controlling JTAG; an instruction register 22; the DDL circuit 23 for delaying a synchronous clock; and a clock controller 24 for controlling the DDL circuit 23 and an unillustrated PLL circuit. The outputs of the TAP controller 21 and the instruction register 22 are provided to the TDR_FFs and the like via gates A4 and A5.

The clock controller 24 controls the DDL circuit 21 and the unillustrated PLL circuit so that the DDL circuit 23 and the PLL circuit can perform transmission with the same frequency as that in actual operation after a test bit is stored in the instruction register 22.

The AND gate A4 provides, to the multiplexers M1 and M2, a control signal for causing the multiplexers M1 and M2 to select data indicating "1," when a test bit is stored in the instruction register 22, and concurrently when ShiftDR="1." By causing the multiplexers M1 and M2 to select data indicating "1," a scan is performed in a TDI (test data in)-TDO (test data out) path in accordance with a test clock TCK, whereby a value is set in each of the TDR_FFs.

The AND gate A5 provides, through the TDR_FFs, a control signal for setting or resetting the FF_Rs, when a test bit is stored in the instruction register 22, and concurrently when UpdateDR_L="1." Whether the FF_Rs are to be set or reset depends on the values set in the TDR_FFs, as described above. In this manner, the initial values of the FF_Rs are determined.

The ClockDR of the TAP controller 21 causes a test clock TCK to be provided to the TDR_FFs when ShiftDR="1," or when CaptureDR="1." In accordance with the test clock TCK, a scan is performed in the TDI-TDO path, and the data stored in the FF_Rs is captured by the TDR_FFs.

Next, a description will be given of operations in the test using the circuit with the above-described configuration.

Figure 21:
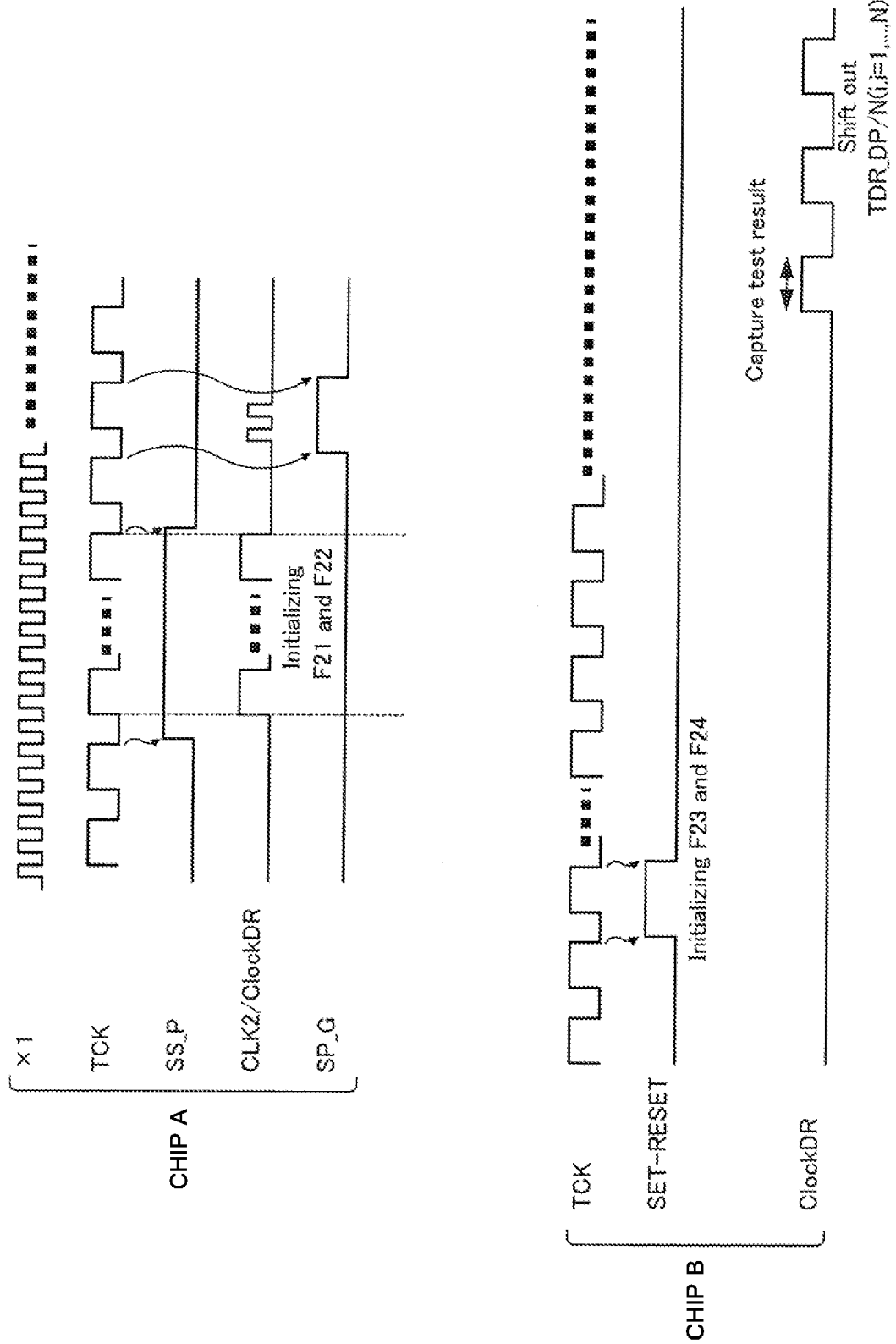
FIG. 21 is a diagram showing signal waveforms during test execution according to the embodiment.

FIG. 21 is a diagram showing signal waveforms in the chips A and B during test execution. The schematic flow of the test is similar to that in the first embodiment described with reference to FIG. 7, and hence will be described here also with reference to FIG. 7.

Firstly, a test bit is stored in each of the instruction registers 15 and 22 respectively of the chips A and B. The PLL circuits 11 of the chips A and B (the PLL circuit of the chip B is not illustrated) are thus triggered to each transmit an operation clock (Step 701). Thereafter, flip-flops for source-synchronous (the FF_Ts and FF_Rs in FIG. 16, and F21 to F24 in FIG. 18) are each initialized to an arbitrary value (Step 702).

Here, each of the flip-flops is initialized by means of a method that conforms to the manner of JTAG 1149 standard, in this embodiment as well. However, refer to FIG. 21. The multiplexer S1 shown in FIG. 17 selects the clock signal ClockDR outputted from the TAP controller 14 in accordance with the SS_P signal, and a scan-shift is thus performed on the data in accordance with this clock signal ClockDR. As a result, the flip-flops F21 and F22 are directly initialized, and the test data is inputted thereto. In the chip B, on the other hand, the flip-flops F23 and F24 are initialized in accordance with the values stored in the TDR_FFs corresponding respectively to the flip-flops F21 and F22, similarly to the first embodiment, as shown in the waveform diagram below (note that this initialization is performed prior to the initialization of the flip-flops F21 and F22 of the chip A in terms of time).

Subsequently, triggered by RunTestIdle="1" of the TR-side chip A, the 2-pulse generator 13 transmits two pulses out of the output from the PLL circuit 11 (Step 703). In this embodiment, the output CLK2 from the 2-pulse generator 13 is selected in the multiplexer S1 of FIG. 17, when ShiftDR="0." Referring to FIG. 6, it is found that a control signal SG_P for causing the FF_Ts to be in a loop state is outputted, and then, clock signals CLK2 for two pulses are outputted.

Then, in accordance with the two pulses, the flip-flops F1 and F22 respectively transmit the test data retained in the flip-flop F1 and a synchronous clock to the REC-side chip B (Step 704). The flip-flops F23 and F24 of the chip B capture the data transmitted from the flip-flop F21 of the chip A in accordance with the synchronous clock transmitted from the flip-flop F22 (Step 705). Thereafter, in the REC-side chip B, the values captured by the flip-flops F23 and F24 are respectively latched into the TDR_DP and TDR_DN. The latched values are then taken out from the TDOs to be observed (Step 706).

Hereinabove, the descriptions have been given by taking, as examples, the cases in each of which flip-flops forming a scan chain of JTAG are used as flip-flops for source-synchronous, in the first to third embodiments. However, it is obvious that configurations other than these are also possible as long as being in accord with the spirit and scope of the present invention. Specifically, the setting of initial values and observation of results can be easily performed by using a scan chain other than JTAG. In current ASICs, a configuration for performing a scan test using JTAG is generally provided. Accordingly, it is highly preferable that a test be performed by using such flip-flops forming a scan chain. However, this does not exclude a case where a separate circuit configuration for performing an interconnect test of the present embodiments is provided in an ASIC.

What is claimed is:

1. A microcomputer on which a plurality of ICs (Integrated Circuits) connected from one another by a source-synchronous interface is mounted, the microcomputer comprising:
   an IC, on the side for transmitting data through the source-synchronous interface, which comprises:
      a PLL (Phase-Locked Loop) circuit being adapted for transmitting an operation clock in actual operation;
      a first flip-flop being adapted for transmitting test data in accordance with the operation clock transmitted from the PLL circuit; and
      a second flip-flop being adapted for transmitting a synchronous clock in source-synchronous, in accordance with the operation clock transmitted from the PLL circuit, and
   an IC, on the side for receiving data through the source-synchronous interface, which comprises:
      a third flip-flop being adapted for capturing, in accordance with the synchronous clock transmitted from the second flip-flop and the test data transmitted from the first flip-flop.

2. The microcomputer according to claim 1, wherein the transmitting-side IC further comprises a 2-pulse generating circuit for extracting two pulse signals from operation clocks transmitted from the PLL circuit, wherein
   the first flip-flop is adapted to transmit the test data in accordance with the two pulse signals extracted in the 2-pulse generating circuit, and
   the second flip-flop is adapted to transmit the synchronous clock in accordance with the two pulse signals extracted in the 2-pulse generating circuit.

3. The microcomputer according to claim 1, wherein the first flip-flop of the transmitting-side IC is adapted to transmit the test data with a delay of a half cycle of the two pulse signals compared to the synchronous clock transmitted from the second flip-flop.

4. The microcomputer according to claim 1, wherein
   the first flip-flop in the transmitting-side IC is adapted to transmit the test data on the same clock edge as that for the synchronous clock transmitted by the second flip-flop, and
   the receiving-side IC further comprises a delay means for providing, to the third flip-flop, the received synchronous clock with a delay of $\pi/2$.

5. The microcomputer according to claim 1, wherein
   the first flip-flop in the transmitting-side IC is a set/reset flip-flop, and
   the transmitting-side IC further comprises a test data register for causing, by setting or resetting the first flip-flop in accordance with a retained value, the first flip-flop to retain the test data.

6. The microcomputer according to claim 1, wherein the first flip-flop in the transmitting-side IC forms a scan chain, and test data is inputted into the first flip-flop by performing a scan-shift on the test data through the scan chain.

7. A method of testing a microcomputer on which a plurality of ICs (Integrated Circuits) connected from one another by a source-synchronous interface is mounted, the method comprising:
   setting initial values in a first flip-flop for data transmission and a second flip-flop for synchronous clock transmission in an IC on the side for transmitting data through the source-synchronous interface;
   transmitting a clock signal from a PLL (Phase-Locked Loop) circuit for transmitting an operation clock in actual operation, and thereafter transmitting the data on the initial values, and the synchronous clock, respectively from the first flip-flop and the second flip-flop; and
   causing a third flip-flop for data reception to capture, in accordance with the synchronous clock transmitted from the second flip-flop, the data on the initial values transmitted from the first flip-flop, in an IC on the side for receiving data through the source-synchronous interface.

8. The method according to claim 7, wherein setting initial values in the first flip-flop and the second flip-flop comprises:
   causing test registers, which are provided to correspond respectively to the first flip-flop and the second flip-flops, to each retain a predetermined value; and
   causing the test registers to set or reset the first flip-flop and the second flip-flop, in accordance with the values retained by the corresponding test registers, so as to set initial values in the first flip-flop and the second flip-flop.

9. The method according to claim 7, wherein, in setting initial values in the first flip-flop and the second flip-flop, the initial values are set by performing, with respect to the first flip-flop and the second flip-flop forming a scan chain, a scan shift on test data through the scan chain.

10. A method of testing a microcomputer on which a plurality of ICs (Integrated Circuits) connected by a source-synchronous interface are mounted, the method comprising:
   a step of causing a flip-flop on the side for transmitting data through the source-synchronous interface to receive and retain test data;
   a step of transmitting a clock signal from a PLL (Phase-Locked Loop) circuit for transmitting an operation clock in actual operation, and of thereafter transmitting the test data, retained in the transmitting-side flip-flop, and a synchronous clock in source-synchronous; and
   a step of causing a flip-flop on the side for receiving data through the source-synchronous interface to capture the test data in accordance with the synchronous clock.

11. The method according to claim 10, wherein the step of causing the transmitting-side flip-flop to receive test data comprises:
- a step of causing a test register to retain a predetermined value, the test register being provided to correspond to the transmitting-side flip-flop; and
- a step of setting or resetting, in accordance with the value retained in the test register, the transmitting-side flip-flop to which the test register corresponds, so as to cause the transmitting-side flip-flop to retain the test data.

12. The method according to claim 10, wherein, in the step of causing the transmitting-side flip-flop to receive test data, the transmitting-side flip-flop is caused to retain the test data by performing, with respect to the transmitting-side flip-flop forming a scan chain, a scan shift on test data through the scan chain.

* * * * *